(12) United States Patent
Yahagi

(10) Patent No.: US 9,035,292 B2
(45) Date of Patent: May 19, 2015

(54) ORGANIC THIN-FILM TRANSISTOR INSULATING LAYER MATERIAL

(75) Inventor: Isao Yahagi, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 52 days.

(21) Appl. No.: 14/118,275

(22) PCT Filed: May 22, 2012

(86) PCT No.: PCT/JP2012/063002
§ 371 (c)(1),
(2), (4) Date: Nov. 18, 2013

(87) PCT Pub. No.: WO2012/161175
PCT Pub. Date: Nov. 29, 2012

(65) Prior Publication Data
US 2014/0070205 A1  Mar. 13, 2014

(30) Foreign Application Priority Data

May 24, 2011 (JP) .................................. 2011-116113
Sep. 1, 2011 (JP) .................................. 2011-190914
Oct. 18, 2011 (JP) .................................. 2011-228763

(51) Int. Cl.
| H01L 51/00 | (2006.01) |
| C08F 12/22 | (2006.01) |
| C08F 12/26 | (2006.01) |
| C08F 12/30 | (2006.01) |
| C08F 212/14 | (2006.01) |
| H01L 51/05 | (2006.01) |

(52) U.S. Cl.
CPC ............ *H01L 51/0071* (2013.01); *C08F 12/22* (2013.01); *C08F 12/26* (2013.01); *C08F 12/30* (2013.01); *C08F 212/14* (2013.01); *H01L 51/052* (2013.01); *H01L 51/0545* (2013.01); *C08F 2800/10* (2013.01)

(58) Field of Classification Search
CPC ..... H01B 3/427; H01L 51/00; H01L 51/0071; H01L 51/5253
USPC ................................................. 257/40; 438/99
See application file for complete search history.

(56) References Cited

U.S. PATENT DOCUMENTS

2011/0193071 A1  8/2011  Yahagi

FOREIGN PATENT DOCUMENTS

| JP | 2007-305950 A |  | 11/2007 |  |
| JP | 2008-40187 A |  | 2/2008 |  |
| JP | 2008040187 A | * | 2/2008 | ............. G03F 7/023 |
| JP | 2009-49396 A |  | 3/2009 |  |
| JP | 2009-102512 A |  | 5/2009 |  |
| WO | 2010/024238 A1 |  | 3/2010 |  |

OTHER PUBLICATIONS

International Preliminary Report on Patentability and Written Opinion issued Nov. 26, 2013 in corresponding International Application No. PCT/JP2012/063002.
D. K. Hwang et al., "Comparative studies on the stability of polymer versus $SiO_2$ gate dielectrics for pentacene thin-film transistors," Applied Physics Letters, 2006, pp. 1-3, vol. 89, 093507.
Se Hyun Kim et al., "Hysteresis-free pentacene field-effect transistors and inverters containing poly(4-vinyl phenol-co-methyl methacrylate) gate dielectrics," Applied Physics Letters, 2008, pp. 1-3, vol. 92, 183306.
International Search Report of PCT/JP2012/063002 dated Aug. 7, 2012.

* cited by examiner

*Primary Examiner* — Daniel Shook
(74) *Attorney, Agent, or Firm* — Sughrue Mion, PLLC

(57) ABSTRACT

An object of the invention is to provide an organic thin film transistor insulating layer material which can be used to produce organic thin film transistors having a small absolute value of threshold voltage and low hysteresis. The solution to the problem is an organic thin film transistor insulating layer material including a macromolecular compound (A) which contains a repeating unit having a cyclic ether structure and a repeating unit having an organic group capable of being detached by an acid.

16 Claims, 1 Drawing Sheet

ORGANIC THIN-FILM TRANSISTOR INSULATING LAYER MATERIAL

CROSS REFERENCE TO RELATED APPLICATIONS

This is a National Stage of International Application No. PCT/JP2012/063002 filed May 22, 2012, claiming priority based on Japanese Patent Application No. 2011-116113 filed May 24, 2011, Japanese Patent Application No. 2011-190914 filed Sep. 1, 2011, and Japanese Patent Application No. 2011-228763 filed Oct. 18, 2011, the contents of all of which are incorporated herein by reference in their entirety.

TECHNICAL FIELD

The present invention relates to a material suitable for forming an insulating layer included in an organic thin film transistor.

BACKGROUND ART

Since organic thin film transistors can be produced at lower temperature than inorganic semiconductors, a plastic substrate or film can be used as substrates of the organic thin film transistors, and by using such a substrate, a device which is more flexible than a transistor including an inorganic semiconductor, and is lightweight and is hardly broken can be produced. Moreover, since a device can be produced by film formation using a method of applying or printing a solution containing an organic material, a large number of devices can be produced on a substrate of large area at low cost.

Furthermore, since there are a wide variety of materials which can be used for the investigation of transistors, a device with a wide range of varied characteristics can be produced if materials varying in molecular structure are used in the investigation.

Further, organic semiconductor compounds to be used for producing an electric field effect type organic thin film transistor which is one aspect of organic thin film transistors are susceptible to environmental influences, such as humidity and oxygen, and therefore transistor characteristics are likely to deteriorate over time due to humidity, oxygen, etc.

Therefore, in the structure of a bottom-gate type organic thin film transistor device, which is one kind of electric field effect type organic thin film transistors, with an organic semiconductor compound exposed thereon, it is necessary to form an overcoat layer covering the whole structure of the device so as to protect the organic semiconductor compound from being in contact with the open air. On the other hand, in the structure of a top gate type organic thin film transistor device, an organic semiconductor compound is coated and protected with a gate insulating layer.

Thus, in organic thin film transistors, insulating layer materials are used in order to form an overcoat insulating layer and a gate insulating layer, both of which cover the organic semiconductor layer. In this specification, an insulating layer or an insulating film of an organic thin film transistor such as the overcoat insulating layer and the gate insulating layer is referred to as an organic thin film transistor insulating layer. In addition, a material used to form the organic thin film transistor insulating layer is referred to as an organic thin film transistor insulating layer material.

The organic thin film transistor insulating layer material is required to have insulating properties and characteristics superior in electrical breakdown strength when having been formed into a thin film. Further, particularly in the bottom-gate type electric field effect transistor, an organic semiconductor layer is formed on the gate insulating layer. Therefore, the organic thin film transistor gate insulating layer material is required to have affinity with an organic semiconductor compound for forming an interface in closely contact with the organic semiconductor layer and to have flatness of the surface on the organic semiconductor layer side of the film formed from the organic thin film transistor gate insulating layer material.

As a technology responding to such requirements, Patent Document 1 describes that an epoxy resin and a silane coupling agent are used in combination as an organic thin film transistor gate insulating layer material. In this technology, a hydroxyl group produced at the time of a curing reaction of the epoxy resin is reacted with the silane coupling agent. The reason for this is that the aforementioned hydroxyl group enhances the hygroscopic properties of the gate insulating layer material and impairs the stability of transistor performance.

Non-Patent Document 1 describes the use of a resin prepared by thermally cross-linking polyvinylphenol and a melamine compound for a gate insulating layer. In this technology, by cross-linking with the melamine compound, the hydroxyl groups contained in the polyvinylphenol are removed and the film strength is increased simultaneously. A pentacene TFT having this gate insulating layer has low hysteresis and exhibits durability to a gate bias stress.

Non-Patent Document 2 describes the use of polyvinylphenol and a copolymer prepared by copolymerizing vinylphenol with methyl methacrylate for a gate insulating layer. In this technology, the polarity of the whole film is reduced by interactions between the hydroxyl group of vinylphenol and the carbonyl group of methyl methacrylate. A pentacene TFT having this gate insulating layer has low hysteresis and exhibits stable electric properties.

BACKGROUND ART DOCUMENTS

Patent Document

Patent Document 1: Japanese Patent Laid-open Publication No. 2007-305950

Non-Patent Documents

Non-Patent Document 1: Appl. Phys. Lett. 89, 093507 (2006)
Non-Patent Document 2: Appl. Phys. Lett. 92, 183306 (2008)

SUMMARY OF THE INVENTION

Problems to be Solved by the Invention

However, in view of practical use of a light-emitting device such as an organic electroluminescence device (organic EL device), it is necessary to improve the operation accuracy of an organic thin film transistor, whereas the above-mentioned organic thin film transistor having a gate insulating layer has a large absolute value of threshold voltage (Vth) and large hysteresis.

An object of the present invention is to provide an organic thin film transistor insulating layer material which can be used to produce organic thin film transistors having a small absolute value of threshold voltage and low hysteresis.

Means for Solving the Problems

In view of the above problems, the present inventors have made various investigations, and consequently found that the absolute value of threshold voltage (Vth) and hysteresis of an organic thin film transistor can be reduced by forming a gate insulating layer with the use of an organic thin film transistor insulating layer material having a specific structure capable of forming a cross-linked structure. These findings have led to completion of the present invention.

That is, the present invention provides an organic thin film transistor insulating layer material comprising a macromolecular compound (A) which contains a repeating unit having a cyclic ether structure and a repeating unit represented by the formula (1):

[Chemical Formula 1]

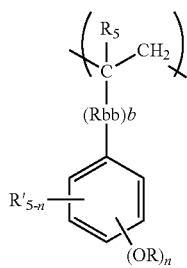

(1)

wherein $R_5$ represents a hydrogen atom or a methyl group; $R_{bb}$ represents a linking moiety which links the main chain of the macromolecular compound with a side chain of the macromolecular compound and optionally has a fluorine atom; R represents an organic group capable of being detached by an acid R' represents a hydrogen atom or a monovalent organic group having from 1 to 20 carbon atoms, wherein any hydrogen atom in the monovalent organic group having 1 to 20 carbon atoms has optionally been substituted with a fluorine atom; b represents an integer of 0 or 1, and n represents an integer of from 1 to 5; and when there are two or more Rs, they may be the same or different; and when there are two or more R's, they may be the same or different.

In one embodiment, the repeating unit having a cyclic ether structure is at least one repeating unit selected from the group consisting of a repeating unit represented by the formula (2):

[Chemical Formula 2]

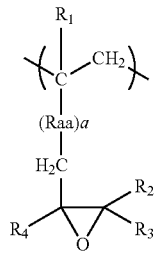

(2)

wherein $R_1$ represents a hydrogen atom or a methyl group; $R_2$ to $R_4$ each independently represent a hydrogen atom or a monovalent organic group having from 1 to 20 carbon atoms; $R_{aa}$ represents a linking moiety which links the main chain of the macromolecular compound with a side chain of the macromolecular compound, and optionally has a fluorine atom; and a represents an integer of 0 or 1, and a repeating unit represented by the formula (3):

[Chemical Formula 3]

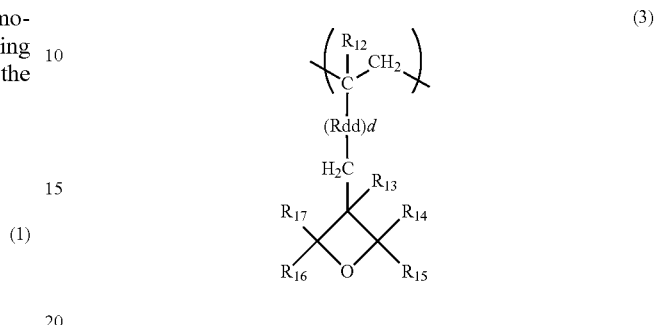

(3)

wherein $R_{12}$ represents a hydrogen atom or a methyl group; $R_{13}$ to $R_{17}$ each independently represent a hydrogen atom or a monovalent organic group having from 1 to 20 carbon atoms; $R_{dd}$ represents a linking moiety which links the main chain of the macromolecular compound with a side chain of the macromolecular compound, and optionally has a fluorine atom; and d represents an integer of 0 or 1.

In one embodiment, the macromolecular compound (A) further contains a repeating unit containing a first functional group, wherein the first functional group is a functional group capable of affording, by the action of electromagnetic waves or heat, a second functional group capable of reacting with active hydrogen.

In one embodiment, the first functional group is at least one group selected from the group consisting of an isocyanato group blocked with a blocking agent and an isothiocyanato group blocked with a blocking agent.

In one embodiment, the isocyanato group blocked with a blocking agent and the isothiocyanato group blocked with a blocking agent are groups represented by the formula (5):

[Chemical Formula 4]

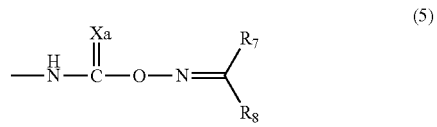

(5)

wherein Xa represents an oxygen atom or a sulfur atom, and $R_7$ and $R_8$ each independently represent a hydrogen atom or a monovalent organic group having from 1 to 20 carbon atoms.

In one embodiment, the isocyanato group blocked with a blocking agent and the isothiocyanato group blocked with a blocking agent are groups represented by the formula (6):

[Chemical Formula 5]

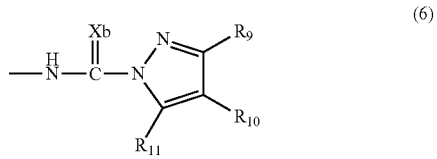

(6)

wherein Xb represents an oxygen atom or a sulfur atom, and $R_9$ and $R_{11}$ each independently represent a hydrogen atom or a monovalent organic group having from 1 to 20 carbon atoms.

In one embodiment, the macromolecular compound (A) further contains a repeating unit represented by the formula (4):

[Chemical Formula 6]

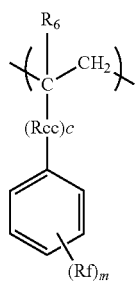

(4)

wherein $R_6$ represents a hydrogen atom or a methyl group; Rf represents a fluorine atom or a monovalent organic group having from 1 to 20 carbon atoms and optionally having a fluorine atom; $R_{cc}$ represents a linking moiety which links the main chain of the macromolecular compound with a side chain of the macromolecular compound, and optionally has a fluorine atom; c represents an integer of 0 or 1, and m represents an integer of from 1 to 5; and when there are two or more Rfs, they may be the same or different, provided that at least one Rf is a fluorine atom or a monovalent organic group having from 1 to 20 carbon atoms and having a fluorine atom.

In one embodiment, the macromolecular compound (A) further contains a repeating unit represented by the formula (8):

[Chemical Formula 7]

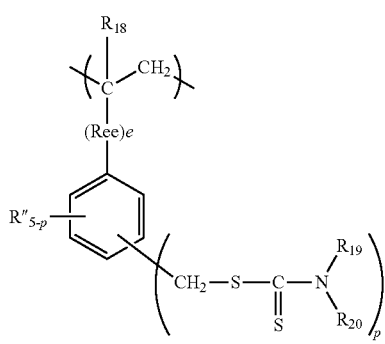

(8)

wherein $R_{18}$ represents a hydrogen atom or a methyl group; $R_{ee}$ represents a linking moiety which links the main chain of the macromolecular compound with a side chain of the macromolecular compound, and optionally has a fluorine atom; $R_{19}$, $R_{20}$ and R" each represent a hydrogen atom or a monovalent organic group having from 1 to 20 carbon atoms; any hydrogen atom in the monovalent organic group having from 1 to 20 carbon atoms has optionally been substituted with a fluorine atom; e represents an integer of 0 or 1 and p represents an integer of from 1 to 5.

Further, the present invention provides a method for forming an organic thin film transistor insulating layer comprising the steps of:

applying a liquid containing any of the organic thin film transistor insulating layer materials onto a substrate to form an applied layer on the substrate; and irradiating the applied layer with electromagnetic waves or electron beams.

Further, the present invention provides a method for forming an organic thin film transistor insulating layer comprising the steps of applying a liquid containing any of the organic thin film transistor insulating layer materials onto a substrate to form an applied layer on the substrate;

irradiating the applied layer with electromagnetic waves or electron beams; and applying heat to the applied layer.

In one embodiment, the electromagnetic waves are ultraviolet rays.

Further, the present invention provides an organic thin film transistor having an organic thin film transistor insulating layer formed by using the organic thin film transistor insulating layer material.

In one embodiment, the organic thin film transistor insulating layer is a gate insulating layer.

Further, the present invention provides a member for a display, the member comprising the organic thin film transistor.

Further, the present invention provides a display comprising the member for a display.

Effects of the Invention

An organic thin film transistor having an insulating layer formed by using the organic thin film transistor insulating layer material of the present invention has a small absolute value of threshold voltage and low hysteresis.

EMBODIMENT FOR CARRYING OUT THE INVENTION

Figure 1:
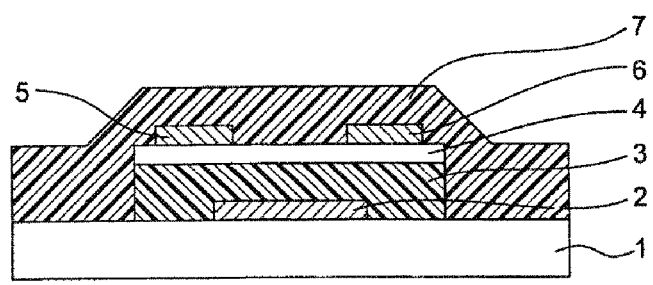
FIG. 1 A schematic cross-sectional view illustrating the structure of a bottom-gate/top-contact type organic thin film transistor which is one embodiment of the present invention.

In this specification, a "macromolecular compound" refers to any compound comprising a structure in which two or more identical structural units are repeated in a molecule, and this includes a so-called dimer. On the other hand, a "low-molecular compound" means any compound that does not have identical structural units repeatedly in a molecule.

The organic thin film transistor insulating layer material of the present invention includes a macromolecular compound (A), and the macromolecular compound (A) contains a repeating unit having a cyclic ether structure and a repeating unit having an organic group capable of being detached by an acid and represented by the formula (1).

The cyclic ether structure is cationically polymerized in an environment where acid is present. Therefore, the macromolecular compound (A) can form a cross-linked structure. Furthermore, for example, when a photo acid generating agent, a photocation polymerization initiator, etc. are used, the cation-polymerization of the cyclic ether structure is excellent in photosensitivity. Consequently, when polymerization initiators such as a photo acid generating agent and a photocation polymerization initiator are used, the cross-linking density of the organic thin film transistor insulating layer is particularly high.

If a cross-linked structure is formed inside the insulating layer, the movement of the molecular structure is inhibited, and thus the polarization of the insulating layer is inhibited. If the polarization of the insulating layer is inhibited, for example, when the insulating layer is used as a gate insulating layer, the absolute value of threshold voltage of an organic thin film transistor is lowered and operation accuracy is improved.

In the formula (1), $R_5$ represents a hydrogen atom or a methyl group. In one embodiment, $R_5$ is a methyl group.

In the formula (1), $R_{bb}$ represents a linking moiety which links the main chain with a side chain and optionally has a fluorine atom. The linking moiety may be a divalent group having a structure which does not exhibit reactivity under environmental conditions where the organic thin film transistor insulating layer material of the present invention is cross-linked. Specific examples of the linking moiety include a bond formed from a divalent organic group having from 1 to 20 carbon atoms, an ether bond (—O—), a ketone bond (—CO—), an ester bond (—COO—, —OCO—), an amide bond (—NHCO—, —CONH—), an urethane bond (—NHCOO—, —OCONH—), and bonds in combination of these bonds. Any hydrogen atom in the linking moiety has optionally been substituted with a fluorine atom. b represents an integer of 0 or 1. In one embodiment, b is 0.

The divalent organic group, represented by $R_{bb}$ and having from 1 to 20 carbon atoms, may be linear, branched, or cyclic, and may be an aliphatic hydrocarbon group or an aromatic hydrocarbon group. Examples of the divalent organic group having from 1 to 20 carbon atoms include divalent linear aliphatic hydrocarbon groups having from 1 to 20 carbon atoms, divalent branched aliphatic hydrocarbon groups having from 3 to 20 carbon atoms, divalent cyclic hydrocarbon groups having from 3 to 20 carbon atoms and divalent aromatic hydrocarbon groups having from 6 to 20 carbon atoms which has optionally been substituted with an alkyl group or the like. Among these groups, divalent linear aliphatic hydrocarbon group having from 1 to 6 carbon atoms, divalent branched aliphatic hydrocarbon group having from 3 to 6 carbon atoms, divalent cyclic hydrocarbon group having from 3 to 6 carbon atoms, and divalent aromatic hydrocarbon groups having from 6 to 20 carbon atoms which has optionally been substituted with an alkyl group or the like are preferred.

Specific examples of the divalent linear aliphatic hydrocarbon groups, the divalent branched aliphatic hydrocarbon groups and the divalent cyclic hydrocarbon groups include a methylene group, an ethylene group, a propylene group, a butylene group, a pentylene group, a hexylene group, an isopropylene group, an isobutylene group, a dimethylpropylene group, a cyclopropylene group, a cyclobutylene group, a cyclopentylene group and a cyclohexylene group.

Specific examples of the divalent aromatic hydrocarbon groups having from 6 to 20 carbon atoms include a phenylene group, a naphthylene group, an anthrylene group, a dimethylphenylene group, a trimethylphenylene group, an ethylenephenylene group, a diethylenephenylene group, a triethylenephenylene group, a propylenephenylene group, a butylenephenylene group, a methylnaphthylene group, a dimethylnaphthylene group, a trimethylnaphthylene group, a vinylnaphthylene group, an ethenylnaphthylene group, a methylanthrylene group and an ethylanthrylene group.

In the formula (1), R' represents a hydrogen atom or a monovalent organic group having from 1 to 20 carbon atoms. The monovalent organic group having from 1 to 20 carbon atoms may be linear, branched, or cyclic, and may be saturated or unsaturated. Any hydrogen atom in the monovalent organic group having from 1 to 20 carbon atoms has optionally been substituted with a fluorine atom.

Examples of the monovalent organic group, represented by R' and having from 1 to 20 carbon atoms, include linear hydrocarbon groups having from 1 to 20 carbon atoms, branched hydrocarbon groups having from 3 to 20 carbon atoms, cyclic hydrocarbon groups having from 3 to 20 carbon atoms and aromatic hydrocarbon groups having from 6 to 20 carbon atoms, and preferred examples thereof include linear hydrocarbon groups having from 1 to 6 carbon atoms, branched hydrocarbon groups having from 3 to 6 carbon atoms, cyclic hydrocarbon groups having from 3 to 6 carbon atoms and aromatic hydrocarbon groups having from 6 to 20 carbon atoms.

Any hydrogen atom contained in the linear hydrocarbon groups having from 1 to 20 carbon atoms, the branched hydrocarbon groups having from 3 to 20 carbon atoms and the cyclic hydrocarbon groups having from 3 to 20 carbon atoms has optionally been substituted with a fluorine atom.

Any hydrogen atom in the aromatic hydrocarbon groups having from 6 to 20 carbon atoms has optionally been substituted with an alkyl group, a fluorine atom, a chlorine atom, a bromine atom, an iodine atom or the like.

Specific examples of the monovalent organic group having from 1 to 20 carbon atoms include a methyl group, an ethyl group, a propyl group, a butyl group, a pentyl group, a hexyl group, an isopropyl group, an isobutyl group, a tertiary butyl group, a cyclopropyl group, a cyclobutyl group, a cyclopentyl group, a cyclohexyl group, a cyclopentynyl group, a cyclohexynyl group, a trifluoromethyl group, a trifluoroethyl group, a phenyl group, a naphthyl group, an anthryl group, a tolyl group, a xylyl group, a dimethylphenyl group, a trimethylphenyl group, an ethylphenyl group, a diethylphenyl group, a triethylphenyl group, a propylphenyl group, a butylphenyl group, a methylnaphthyl group, a dimethylnaphthyl group, a trimethylnaphthyl group, a vinylnaphthyl group, an ethenylnaphthyl group, a methylanthryl group, an ethylanthryl group, a chlorophenyl group and a bromophenyl group.

An alkyl group is preferred as the monovalent organic group having from 1 to 20 carbon atoms.

In the formula (1), R represents an organic group capable of being detached by an acid. The organic group capable of being detached by an acid is preferably an organic group which leaves by the action of an acid to produce a phenolic hydroxyl group. The phenolic hydroxyl group can react with the cyclic ether structure to form a cross-linked structure. Also, the phenolic hydroxyl group may terminate cation polymerization or reduce the rate of the cation polymerization in some cases due to chain transfer, and the phenolic hydroxyl group can suppress the excessive progress of the cation polymerization of the cyclic ether structure in the presence of acid.

Examples of the organic group capable of being detached by an acid include alkoxyalkyl groups having from 2 to 20 carbon atoms and optionally having a substituent, groups having from 3 to 20 carbon atoms and having a cyclic hydrocarbon structure such as an adamantyl group, tertiary alkyl groups, a tetrahydrofuranyl group, a tetrahydropyranyl group, and a 4-methoxytetrahydropyranyl group.

Examples of the substituent, which may be included in the alkoxyalkyl group having from 2 to 20 carbon atoms, include alkoxy groups having from 1 to 20 carbon atoms, alkyl groups having from 1 to 20 carbon atoms, aromatic hydrocarbon groups having from 6 to 20 carbon atoms and halogen atoms. Examples of the alkoxyalkyl groups having from 2 to 20 carbon atoms and optionally having a substituent include a methoxy methyl group, a methoxyethoxy methyl group, a 1-ethoxyethyl group, a 2-ethoxyethyl group, a bis(2-chloroethoxy)methyl group, a 1-methyl-1-methoxyethyl group and a 1-isopropoxyethyl group.

Examples of the tertiary alkyl groups include t-butyl groups.

Examples of the groups having from 3 to 20 carbon atoms and having a cyclic hydrocarbon structure include a cyclopropyl methyl group, a cyclohexyl group and 1-hydroxyadamantyl group.

In the formula (1), n represents an integer of from 1 to 5. In one embodiment, n is 1.

The repeating unit having a cyclic ether structure is preferably at least one repeating unit selected from the group consisting of a repeating unit represented by the formula (2) and a repeating unit represented by the formula (3).

In one preferred embodiment, the macromolecular compound (A) contains both of the repeating unit represented by the formula (2) and the repeating unit represented by the formula (3). The reason for this is that the initiation and progress of polymerization of the cyclic ether are promoted.

In the formula (2), $R_1$ represents a hydrogen atom or a methyl group. In one embodiment, $R_1$ is a methyl group.

In the formula (2), $R_2$ to $R_4$ each independently represent a hydrogen atom or a monovalent organic group having from 1 to 20 carbon atoms. Any hydrogen atom in the monovalent organic group has optionally been substituted been substituted with a fluorine atom. The monovalent organic group having from 1 to 20 carbon atoms may be linear, branched, or cyclic, and may be saturated or unsaturated.

Examples of the monovalent organic group having from 1 to 20 carbon atoms include linear hydrocarbon groups having from 1 to 20 carbon atoms, branched hydrocarbon groups having from 3 to 20 carbon atoms, cyclic hydrocarbon groups having from 3 to 20 carbon atoms and aromatic hydrocarbon groups having from 6 to 20 carbon atoms, and preferred examples thereof include linear hydrocarbon groups having from 1 to 6 carbon atoms, branched hydrocarbon groups having from 3 to 6 carbon atoms, cyclic hydrocarbon groups having from 3 to 6 carbon atoms and aromatic hydrocarbon groups having from 6 to 20 carbon atoms.

Any hydrogen atom contained in the linear hydrocarbon groups having from 1 to 20 carbon atoms, the branched hydrocarbon groups having from 3 to 20 carbon atoms and the cyclic hydrocarbon groups having from 3 to 20 carbon atoms has optionally been substituted with a fluorine atom.

Any hydrogen atom in the aromatic hydrocarbon groups having from 6 to 20 carbon atoms has optionally been substituted with an alkyl group, a fluorine atom, a chlorine atom, a bromine atom, an iodine atom or the like.

Specific examples of the monovalent organic groups, represented by $R_2$ to $R_4$ and having from 1 to 20 carbon atoms, include the same groups as in the specific examples of the above monovalent organic groups, represented by R' and having from 1 to 20 carbon atoms.

As the monovalent organic groups represented by $R_2$ to $R_4$ and having from 1 to 20 carbon atoms, alkyl groups are preferred.

In the formula (2), $R_{aa}$ represents a linking moiety which links the main chain with a side chain and optionally has a fluorine atom. The linking moiety may be a divalent group having a structure which does not exhibit reactivity under environmental conditions where the organic thin film transistor insulating layer material of the present invention is cross-linked. Specific examples of the linking moiety include a bond formed from a divalent organic group having from 1 to 20 carbon atoms, an ether bond (—O—), a ketone bond (—CO—), an ester bond (—COO—, —OCO—), an amide bond (—NHCO—, —CONH—), an urethane bond (—NHCOO—, —OCONH—), and bonds in combination of these bonds.

a represents an integer of 0 or 1. In one embodiment, a is 1.

The divalent organic group, represented by $R_{aa}$ and having from 1 to 20 carbon atoms, may be linear, branched, or cyclic, and may be an aliphatic hydrocarbon group or an aromatic hydrocarbon group. Examples of the divalent organic group having from 1 to 20 carbon atoms include divalent linear aliphatic hydrocarbon groups having from 1 to 20 carbon atoms, divalent branched aliphatic hydrocarbon groups having from 3 to 20 carbon atoms, divalent cyclic hydrocarbon groups having from 3 to 20 carbon atoms and divalent aromatic hydrocarbon groups having from 6 to 20 carbon atoms which has optionally been substituted with an alkyl group or the like. Among these groups, divalent linear aliphatic hydrocarbon group having from 1 to 6 carbon atoms, divalent branched aliphatic hydrocarbon group having from 3 to 6 carbon atoms, divalent cyclic hydrocarbon group having from 3 to 6 carbon atoms, and divalent aromatic hydrocarbon groups having from 6 to 20 carbon atoms which has optionally been substituted with an alkyl group or the like are preferred.

Specific examples of the divalent organic groups, represented by $R_{aa}$ and having from 1 to 20 carbon atoms, include the same groups as in the specific examples of the above divalent organic groups, represented by $R_{bb}$ and having from 1 to 20 carbon atoms.

In the formula (3), $R_{12}$ represents a hydrogen atom or a methyl group. In one embodiment, $R_{12}$ is a methyl group.

In the formula (3), $R_{13}$ to $R_{17}$ each independently represent a hydrogen atom or a monovalent organic group having from 1 to 20 carbon atoms. Any hydrogen atom in the monovalent organic group has optionally been substituted with a fluorine atom. The monovalent organic group having from 1 to 20 carbon atoms may be linear, branched, or cyclic, and may be saturated or unsaturated.

Examples of the monovalent organic group having from 1 to 20 carbon atoms include linear hydrocarbon groups having from 1 to 20 carbon atoms, branched hydrocarbon groups having from 3 to 20 carbon atoms, cyclic hydrocarbon groups having from 3 to 20 carbon atoms and aromatic hydrocarbon groups having from 6 to 20 carbon atoms, and preferred examples thereof include linear hydrocarbon groups having from 1 to 6 carbon atoms, branched hydrocarbon groups having from 3 to 6 carbon atoms, cyclic hydrocarbon groups having from 3 to 6 carbon atoms and aromatic hydrocarbon groups having from 6 to 20 carbon atoms.

A hydrogen atom contained in the linear hydrocarbon groups having from 1 to 20 carbon atoms, the branched hydrocarbon groups having from 3 to 20 carbon atoms and the cyclic hydrocarbon groups having from 3 to 20 carbon atoms has optionally been substituted with a fluorine atom.

Any hydrogen atom in the aromatic hydrocarbon groups having from 6 to 20 carbon atoms has optionally been substituted with an alkyl group, a fluorine atom, a chlorine atom, a bromine atom, an iodine atom or the like.

Specific examples of the monovalent organic groups, represented by $R_{13}$ to $R_{17}$ and having from 1 to 20 carbon atoms, include the same groups as in the specific examples of the above monovalent organic groups, represented by R' and having from 1 to 20 carbon atoms.

As the monovalent organic groups represented by $R_{13}$ to $R_{17}$ and having from 1 to 20 carbon atoms, alkyl groups are preferred.

In the formula (3), $R_{dd}$ represents a linking moiety which links the main chain with a side chain and optionally has a fluorine atom. The linking moiety may be a divalent group having a structure which does not exhibit reactivity under environmental conditions where the organic thin film transistor insulating layer material of the present invention is cross-linked. Specific examples of the linking moiety include a bond formed from a divalent organic group having from 1 to 20 carbon atoms, an ether bond (—O—), a ketone bond (—CO—), an ester bond (—COO—, —OCO—), an amide bond (—NHCO—, —CONH—), an urethane bond (—NHCOO—, —OCONH—), and bonds in combination of these bonds. d represents an integer of 0 or 1. In one embodiment, d is 1.

The divalent organic group, represented by $R_{dd}$ and having from 1 to 20 carbon atoms, may be linear, branched, or cyclic, and may be an aliphatic hydrocarbon group or an aromatic hydrocarbon group. Examples of the divalent organic group having from 1 to 20 carbon atoms include divalent linear aliphatic hydrocarbon groups having from 1 to 20 carbon atoms, divalent branched aliphatic hydrocarbon groups having from 3 to 20 carbon atoms, divalent cyclic hydrocarbon groups having from 3 to 20 carbon atoms and divalent aromatic hydrocarbon groups having from 6 to 20 carbon atoms which has optionally been substituted with an alkyl group or the like. Among these groups, divalent linear aliphatic hydrocarbon group having from 1 to 6 carbon atoms, divalent branched aliphatic hydrocarbon group having from 3 to 6 carbon atoms, divalent cyclic hydrocarbon group having from 3 to 6 carbon atoms, and divalent aromatic hydrocarbon groups having from 6 to 20 carbon atoms which has optionally been substituted with an alkyl group or the like are preferred.

Specific examples of the divalent organic groups, represented by $R_{aa}$ and having from 1 to 20 carbon atoms, include the same groups as in the specific examples of the above divalent organic groups, represented by $R_{bb}$ and having from 1 to 20 carbon atoms.

One aspect of the macromolecular compound (A) of the present invention is a macromolecular compound further containing at least one repeating unit selected from the group consisting of a repeating unit containing a group which includes a fluorine atom, a repeating unit containing a first functional group, wherein the first functional group is a functional group capable of affording, by the action of electromagnetic waves or heat, a second functional group capable of reacting with active hydrogen, and a repeating unit containing a group which produces stabilized radicals by the action of electromagnetic waves or heat, in addition to the repeating unit represented by the formula (1), and the repeating unit represented by the formula (2) or the repeating unit represented by the formula (3). In the present specification, the "active hydrogen" means a hydrogen atom coupled with an oxygen atom, a sulfur atom or a nitrogen atom.

The first functional group does not react with active hydrogen. However, when the first functional group is subjected to electromagnetic wave irradiation or subjected to the action of heat, the second functional group is produced and reacts with active hydrogen. That is, the first functional group can be deprotected by the action of electromagnetic waves or heat to afford the second functional group capable of reacting with active hydrogen. The second functional group reacts with an active hydrogen-containing group contained in the organic thin film transistor insulating layer material and is bound to the active hydrogen-containing group so that it can form a cross-linked structure within the insulating layer. Further, the amount of the active hydrogen contained in the insulating layer is reduced by the reaction of the active hydrogen-containing group with the second functional group to suppress the polarization of the insulating layer.

Examples of the active hydrogen-containing group contained in the organic thin film transistor insulating layer material include hydroxyl groups produced when the cyclic ether structure is polymerized in the presence of acid; and hydroxyl groups produced when organic groups are detached from the repeating unit represented by the formula (1) by the action of acid.

The organic thin film transistor insulating layer material of the present invention may further contain at least one active hydrogen compound selected from the group consisting of an active hydrogen compound which is a low-molecular compound containing two or more active hydrogens and an active hydrogen compound which is a macromolecular compound containing two or more active hydrogens. In the present specification, the "active hydrogen compound" means a compound having one or more active hydrogens.

The stabilized radical can form a carbon-carbon bond by radical coupling. Thus, when the repeating unit containing a group to produce the stabilized radical is contained in the macromolecular compound (A), a cross-linked structure can be formed within the insulating layer. Also, the stabilized radical can initiate radical polymerization of a compound having a double bond. Accordingly, when the organic thin film transistor insulating layer material includes the compound having a double bond, a cross-linked structure can be formed within the insulating layer. At this time, a radical reaction progresses in parallel with a polymerization reaction of the cyclic ether structure to effectively increase the cross-linking density of the organic thin film transistor insulating layer.

Herein, the active hydrogen refers to a hydrogen atom which bonds to an atom other than a carbon atom, such as an oxygen atom, a nitrogen atom or a sulfur atom.

The repeating unit containing a group which includes a fluorine atom is preferably a repeating unit represented by the formula (4). In the formula (4), $R_6$ represents a hydrogen atom or a methyl group. In one embodiment, $R_6$ is a methyl group.

In the formula (4), $R_{cc}$ represents a linking moiety which links the main chain with a side chain and optionally has a fluorine atom. The linking moiety may be a divalent group having a structure which does not exhibit reactivity under environmental conditions where the organic thin film transistor insulating layer material of the present invention is cross-linked. Specific examples of the linking moiety include a bond formed from a divalent organic group having from 1 to 20 carbon atoms, an ether bond (—O—), a ketone bond (—CO—), an ester bond (—COO—, —OCO—), an amide bond (—NHCO—, —CONH—), an urethane bond (—NHCOO—, —OCONH—), and bonds in combination of these bonds.

Specific examples of the divalent organic groups, represented by $R_{cc}$ and having from 1 to 20 carbon atoms, include the same groups as in the specific examples of the above divalent organic groups, represented by $R_{bb}$ and having from 1 to 20 carbon atoms.

c is an integer of 0 or 1. In one embodiment, c is 0.

In the formula (4), Rf represents a fluorine atom or a monovalent organic group having from 1 to 20 carbon atoms, which optionally has a fluorine atom. In one embodiment, Rf is a fluorine atom.

When fluorine is introduced into the organic thin film transistor insulating layer material, the formed insulating layer as a whole is low in polarity and contains little components which are polarized easily when a voltage is applied, so that the polarization of the insulating layer is suppressed.

A fluorine atom is preferably substituted for a hydrogen atom of a side chain or a side group (a pendant group) of a macromolecular compound, rather than for a hydrogen atom of the main chain of the macromolecular compound. If a fluorine atom is substituted at the side chain or the side group, affinity with other organic materials such as an organic semiconductor does not deteriorate, and in the case of forming a layer including the organic materials, the organic materials well contact with an exposed surface of the insulating layer, and this facilitates formation of a layer.

However, the characteristics of the organic thin film transistor may be adversely affected or improvements in the characteristics may not be achieved in some cases when fluorine is introduced into the organic thin film transistor insulating layer material. The reason for this is that the characteristics of the organic thin film transistor vary depending on the kind and characteristics of the constituent members, such as a semiconductor layer, other than the organic thin film transistor insulating layer. When the characteristics of the organic thin film transistor are not improved even when fluorine is introduced into the organic thin film transistor insulating layer material, it is not necessary to introduce fluorine into the organic thin film transistor insulating layer material. Further, when the characteristics of the organic thin film transistor are deteriorated in the case of introducing fluorine into the organic thin film transistor insulating layer material, it is preferred not to introduce fluorine into the organic thin film transistor insulating layer material.

m represents an integer of from 1 to 5. In one embodiment, m is 5.

The monovalent organic groups, represented by Rf and having from 1 to 20 carbon atoms, optionally has a fluorine atom, may be linear, branched or cyclic, and may be saturated or unsaturated.

Examples of the monovalent organic group having from 1 to 20 carbon atoms include linear hydrocarbon groups having from 1 to 20 carbon atoms, branched hydrocarbon groups having from 3 to 20 carbon atoms, cyclic hydrocarbon groups having from 3 to 20 carbon atoms and aromatic hydrocarbon groups having from 6 to 20 carbon atoms, and preferred examples thereof include linear hydrocarbon groups having from 1 to 6 carbon atoms, branched hydrocarbon groups having from 3 to 6 carbon atoms, cyclic hydrocarbon groups having from 3 to 6 carbon atoms and aromatic hydrocarbon groups having from 6 to 20 carbon atoms.

Any hydrogen atom in the aromatic hydrocarbon groups having from 6 to 20 carbon atoms has optionally been substituted with an alkyl group, a chlorine atom, a bromine atom, an iodine atom or the like.

When Rf is a monovalent organic group having from 1 to 20 carbon atoms and not having a fluorine atom, specific examples of the monovalent organic group having from 1 to 20 carbon atoms and not having a fluorine atom include a methyl group, an ethyl group, a propyl group, a butyl group, a pentyl group, a hexyl group, an isopropyl group, an isobutyl group, a tertiary butyl group, a cyclopropyl group, a cyclobutyl group, a cyclopentyl group, a cyclohexyl group, a cyclopentynyl group, a cyclohexynyl group, a phenyl group, a naphthyl group, an anthryl group, a tolyl group, a xylyl group, a dimethylphenyl group, a trimethylphenyl group, an ethylphenyl group, a diethylphenyl group, a triethylphenyl group, a propylphenyl group, a butylphenyl group, a methylnaphthyl group, a dimethylnaphthyl group, a trimethylnaphthyl group, a vinylnaphthyl group, an ethenylnaphthyl group, a methylanthryl group, an ethylanthryl group, a chlorophenyl group and a bromophenyl group.

An alkyl group is preferred among these groups.

When Rf is an organic group having a fluorine atom and having from 1 to 20 carbon atoms, examples of the monovalent organic group having a fluorine atom and having from 1 to 20 carbon atoms include a trifluoromethyl group, a 2,2,2-trifluoroethyl group, a 2,2,3,3,3-pentafluoropropyl group, a 2-(perfluorobutyl)ethyl group, a pentafluorophenyl group and a trifluoromethylphenyl group.

As the monovalent organic group, represented by Rf and having from 1 to 20 carbon atoms, which optionally has a fluorine atom, alkyl groups substituted with a fluorine atom are preferred.

In the formula (4), at least one Rf is a fluorine atom, or a monovalent organic group having from 1 to 20 carbon atoms, which has a fluorine atom. Preferably, b is 5, and five Rfs are fluorine atoms, or monovalent organic groups having from 1 to 20 carbon atoms, which have a fluorine atom.

The second functional group is protected (blocked) and is present in the organic thin film transistor insulating layer material in the form of the first functional group before electromagnetic waves or heat is applied in the step of forming the organic thin film transistor insulating layer. As a result, storage stability of the organic thin film transistor insulating layer material is improved.

Preferred examples of the first functional group include an isocyanato group blocked with a blocking agent and an isothiocyanato group blocked with a blocking agent.

The aforementioned isocyanato group blocked with a blocking agent or the aforementioned isothiocyanato group blocked with a blocking agent can be produced by reacting a blocking agent having only one active hydrogen capable of reacting with an isocyanato group or an isothiocyanato group in a molecule with an isocyanato group or an isothiocyanato group.

As the blocking agent, one which dissociates at a temperature of 170° C. or lower even after reacting with an isocyanato group or an isothiocyanato group is preferred. Examples of the blocking agent include alcohol type compounds, phenol type compounds, active methylene type compounds, mercaptan type compounds, acid amide type compounds, acid imide type compounds, imidazole type compounds, urea type compounds, oxime type compounds, amine type compounds, imine type compounds, bisulfites, pyridine type compounds and pyrazole type compounds. These blocking agents may be used alone or may be used as a mixture of two or more of them. Preferred blocking agent includes oxime type compounds and pyrazole type compounds.

Specific examples of the blocking agents are shown below. Examples of the alcohol type compounds include methanol, ethanol, propyl alcohol, butanol, 2-ethylhexanol, methylcellosolve, butylcellosolve, methylcarbitol, benzyl alcohol and cyclohexanol. Examples of the phenol type compounds include phenol, cresol, ethylphenol, butylphenol, nonylphenol, dinonylphenol, styrenated phenol and hydroxybenzoic acid esters. Examples of the active methylene type compounds include dimethyl malonate, diethyl malonate, methyl acetoacetate, ethyl acetoacetate and acetylacetone. Examples of the mercaptan type compounds include butyl mercaptan and dodecylmercaptan. Examples of the acid amide type compounds include acetanilide, acetic acid amide, ∈-caprolactam, δ-valerolactam and γ-butyrolactam. Examples of the acid imide type compounds include succinimide and maleimide. Examples of the imidazole type compounds include imidazole and 2-methylimidazole. Examples of the urea type compounds include urea, thiourea and ethyleneurea. Examples of the oxime type compounds include formaldoxime, acetaldoxime, acetoxime, methylethylketoxime and cyclohexanone oxime. Examples of the amine type compounds include diphenylamine, aniline and carbazole. Examples of the imine type compounds include ethyleneimine and polyethyleneimine. Examples of the bisulfites include sodium bisulfite. Examples of the pyridine type compounds include 2-hydroxypyridine and 2-hydroxyquinoline. Examples of the pyrazole type compounds include 3,5-dimethylpyrazole and 3,5-diethylpyrazole.

As the isocyanato group or the isothiocyanato group blocked with a blocking agent, which may be used in the present invention, a group represented by the formula (5) or a group represented by the formula (6) is preferred.

In the formula (5) and the formula (6), Xa represents an oxygen atom or a sulfur atom, Xb represents an oxygen atom or a sulfur atom, and $R_7$ to $R_{11}$ each independently represent a hydrogen atom or a monovalent organic group having from 1 to 20 carbon atoms.

The monovalent organic groups, represented by $R_7$ to $R_{11}$ and having from 1 to 20 carbon atoms, may be linear, branched or cyclic, and may be saturated or unsaturated.

Examples of the monovalent organic group having from 1 to 20 carbon atoms include linear hydrocarbon groups having from 1 to 20 carbon atoms, branched hydrocarbon groups having from 3 to 20 carbon atoms, cyclic hydrocarbon groups having from 3 to 20 carbon atoms and aromatic hydrocarbon groups having from 6 to 20 carbon atoms, and preferred examples thereof include linear hydrocarbon groups having from 1 to 6 carbon atoms, branched hydrocarbon groups having from 3 to 6 carbon atoms, cyclic hydrocarbon groups having from 3 to 6 carbon atoms and aromatic hydrocarbon groups having from 6 to 20 carbon atoms.

Any hydrogen atom contained in the linear hydrocarbon groups having from 1 to 20 carbon atoms, the branched hydrocarbon groups having from 3 to 20 carbon atoms and the cyclic hydrocarbon groups having from 3 to 20 carbon atoms has optionally been substituted with a fluorine atom.

Any hydrogen atom in the aromatic hydrocarbon groups having from 6 to 20 carbon atoms has optionally been substituted with an alkyl group, a fluorine atom, a chlorine atom, a bromine atom, an iodine atom or the like.

Specific examples of the monovalent organic groups, represented by $R_7$ to $R_{11}$ and having from 1 to 20 carbon atoms, include a methyl group, an ethyl group, a propyl group, a butyl group, a pentyl group, a hexyl group, an isopropyl group, an isobutyl group, a tertiary butyl group, a cyclopropyl group, a cyclobutyl group, a cyclopentyl group, a cyclohexyl group, a cyclopentynyl group, a cyclohexynyl group, a trifluoromethyl group, a trifluoroethyl group, a phenyl group, a naphthyl group, an anthryl group, a tolyl group, a xylyl group, a dimethylphenyl group, a trimethylphenyl group, an ethylphenyl group, a diethylphenyl group, a triethylphenyl group, a propylphenyl group, a butylphenyl group, a methylnaphthyl group, a dimethylnaphthyl group, a trimethylnaphthyl group, a vinylnaphthyl group, an ethenylnaphthyl group, a methylanthryl group, an ethylanthryl group, a chlorophenyl group and a bromophenyl group.

As the monovalent organic groups represented by $R_7$ to $R_{11}$ and having from 1 to 20 carbon atoms, alkyl groups are preferred.

In one embodiment, $R_7$ to $R_{11}$ are hydrogen atoms.

Examples of the isocyanato group blocked with a blocking agent include an O-(methylideneamino)carboxyamino group, an O-(1-ethylideneamino)carboxyamino group, an O-(1-methylethylideneamino)carboxyamino group, an O-[1-methylpropylideneamino]carboxyamino group, an (N-3,5-dimethylpyrazolylcarbonyl)amino group, an (N-3-ethyl-5-methylpyrazolylcarbonyl)amino group, an (N-3,5-diethylpyrazolylcarbonyl)amino group, an (N-3-propyl-5-methylpyrazolylcarbonyl)amino group and an (N-3-ethyl-5-propylpyrazolylcarbonyl)amino group.

Examples of the isothiocyanato group blocked with a blocking agent include an O-(methylideneamino)thiocarboxyamino group, an O-(1-ethylideneamino)thiocarboxyamino group, an O-(1-methylethylideneamino)thiocarboxyamino group, an O-[1-methylpropylideneamino]thiocarboxyamino group, an (N-3,5-dimethylpyrazolylthiocarbonyl)amino group, an (N-3-ethyl-5-methylpyrazolylthiocarbonyl)amino group, an (N-3,5-diethylpyrazolylthiocarbonyl)amino group, an (N-3-propyl-5-methylpyrazolylthiocarbonyl)amino group and an (N-3-ethyl-5-propylpyrazolylthiocarbonyl)amino group.

An isocyanato group blocked with a blocking agent is preferred as the first functional group.

Examples of the stabilized radicals include benzyl radicals (Ph-CH$_2$·). Examples of the functional groups which absorb energy to produce benzyl radicals, include benzyl diethyl dithiocarbamate (Ph-CH$_2$—SCSNEt$_2$), and benzyl chloride (Ph-CH$_2$—Cl).

Among these, benzyl diethyl dithiocarbamate is preferred since it is capable of affording benzyl radicals by either of the irradiation with ultraviolet rays and the application of heat. Accordingly, the repeating unit having a group which produces stabilized radicals by the action of electromagnetic waves or heat is preferably a repeating unit represented by the formula (8).

In the formula (8), $R_{18}$ represents a hydrogen atom or a methyl group. In one embodiment, $R_{18}$ is a hydrogen atom.

In the formula (8), $R_{19}$, $R_{20}$ and R" represent a hydrogen atom or a monovalent organic group having from 1 to 20 carbon atoms. The monovalent organic group having from 1 to 20 carbon atoms may be linear, branched, or cyclic, and may be saturated or unsaturated. Any hydrogen atom in the monovalent organic group having from 1 to 20 carbon atoms has optionally been substituted with a fluorine atom.

Specific examples of the monovalent organic groups, represented by $R_{19}$, $R_{20}$ and R" and having from 1 to 20 carbon atoms, include the same groups as in the specific examples of the above monovalent organic groups, represented by R' and having from 1 to 20 carbon atoms.

In the formula (8), $R_{ee}$ represents a linking moiety which links the main chain with a side chain and optionally has a fluorine atom. The linking moiety may be a divalent group having a structure which does not exhibit reactivity under environmental conditions where the organic thin film transistor insulating layer material of the present invention is cross-linked. Specific examples of the linking moiety include a bond formed from a divalent organic group having from 1 to 20 carbon atoms, an ether bond (—O—), a ketone bond (—CO—), an ester bond (—COO—, —OCO—), an amide bond (—NHCO—, —CONH—), an urethane bond (—NH-COO—, —OCONH—), and bonds in combination of these bonds.

Specific examples of the divalent organic groups, represented by $R_{ee}$ and having from 1 to 20 carbon atoms, include the same groups as in the specific examples of the above divalent organic groups, represented by $R_{bb}$ and having from 1 to 20 carbon atoms.

e represents an integer of 0 or 1. In one embodiment, e is 0.

In the formula (8), p represents an integer of from 1 to 5. In one embodiment, p is 1.

The macromolecular compound (A) can be produced by, for example, a method of copolymerizing, by using a photopolymerization initiator or a thermal polymerization initiator, a mixture of a polymerizable monomer serving as a raw material of the repeating unit represented by the formula (1), a polymerizable monomer serving as a raw material of the repeating unit represented by the formula (2) or a polymerizable monomer serving as a raw material of the repeating unit represented by the formula (3), and a polymerizable monomer serving as a raw material of the repeating unit represented by the formula (4), and a polymerizable monomer containing the first functional group or a polymerizable monomer serving as a raw material of the repeating unit represented by the formula (8).

Examples of the polymerizable monomer serving as a raw material of the repeating unit represented by the formula (1) include 4-(methoxymethoxy)styrene, 4-(methoxyethoxymethoxy)styrene, 4-(1-ethoxyethoxy)styrene, 4-(tetrahydropyranyloxy)styrene, 4-(cyclopropylmethyloxy)styrene and 4-(cyclohexyloxy)styrene.

Examples of the polymerizable monomer serving as a raw material of the repeating unit represented by the formula (2) include glycidyl acrylate, glycidyl methacrylate, 2-glycidyl ethyl acrylate and 2-glycidyl ethyl methacrylate.

Examples of the polymerizable monomer serving as a raw material of the repeating unit represented by the formula (3) include 3-acryloyloxymethyl-3-ethyl oxetane and 3-methacryloyloxymethyl-3-ethyl oxetane.

Examples of the polymerizable monomer serving as a raw material of the repeating unit represented by the formula (4) include 2-trifluoromethylstyrene, 3-trifluoromethylstyrene, 4-trifluoromethylstyrene, 2,3,4,5,6-pentafluorostyrene and 4-fluorostyrene.

Examples of the polymerizable monomer containing the first functional group include monomers having the isocyanato group blocked with a blocking agent or the isothiocyanato group blocked with a blocking agent and an unsaturated bond. The monomers having the isocyanato group blocked with a blocking agent or the isothiocyanato group blocked with a blocking agent, and an unsaturated bond can be produced by reacting a compound having an isocyanato group or an isothiocyanato group and an unsaturated bond with a blocking agent. A double bond is preferred as the unsaturated bond.

Examples of the compound, having a double bond and an isocyanato group, include 2-acryloyloxyethylisocyanate, 2-methacryloyloxyethylisocyanate and 2-(2'-methacryloyloxyethyl)oxyethylisocyanate. Examples of the compound having a double bond and an isothiocyanato group include 2-acryloyloxyethylisothiocyanate, 2-methacryloyloxyethylisothiocyanate and 2-(2'-methacryloyloxyethyl)oxyethylisothiocyanate.

The aforementioned blocking agents can be suitably used for producing the polymerizable monomer containing the first functional group. In producing the monomers having the isocyanato group blocked with a blocking agent or the isothiocyanato group blocked with a blocking agent, and an unsaturated bond by reacting the compound having an isocyanato group or an isothiocyanato group, and an unsaturated bond with a blocking agent, an organic solvent, a catalyst, etc. can be added as necessary.

Examples of the aforementioned monomer having, in the molecule thereof, the isocyanato group blocked with a blocking agent and an double bond include 2-[O-[1'-methylpropylideneamino]carboxyamino]ethyl methacrylate and 2-[N-[1', 3'-dimethylpyrazolyl]carbonylamino]ethyl methacrylate.

Examples of the aforementioned monomer, having the isothiocyanato group blocked with a blocking agent and a double bond, include 2-[O-[1'-methylpropylideneamino] thiocarboxyamino]ethyl methacrylate and 2-[N-[1',3'-dimethylpyrazolyl]thiocarbonylamino]ethyl methacrylate.

Examples of the polymerizable monomer serving as a raw material of the repeating unit represented by the formula (8) include 3-(N,N-diethyldithiocarbamylmethyl)styrene and 4-(N,N-diethyldithiocarbamylmethyl) styrene.

Examples of the photopolymerization initiator include carbonyl compounds such as acetophenone, 2,2-dimethoxy-2-phenylacetophenone, 2,2-diethoxyacetophenone, 4-isopropyl-2-hydroxy-2-methylpropiophenone, 2-hydroxy-2-methylpropiophenone, 4,4'-bis(diethylamino) benzophenone, benzophenone, methyl(o-benzoyl)benzoate, 1-phenyl-1,2-propanedione-2-(O-ethoxycarbonyl)oxime, 1-phenyl-1,2-propanedione-2-(o-benzoyl)oxime, benzoin, benzoin methyl ether, benzoin ethyl ether, benzoin isopropyl ether, benzoin isobutyl ether, benzoin octyl ether, benzil, benzyl dimethyl ketal, benzyl diethyl ketal, and diacetyl; derivatives of anthraquinone or thioxanthone, such as methylanthraquinone, chloroanthraquinone, chlorothioxanthone, 2-methylthioxanthone, and 2-isopropylthioxanthone; and sulfur compounds, such as diphenyldisulfide, and dithiocarbamate.

When light energy is used as energy to initiate copolymerization, the wavelength of light for irradiation of the polymerizable monomer is 360 nm or more, preferably from 360 to 450 nm.

The thermal polymerization initiator may be any substance that can serve as an initiator of radical polymerization, and examples thereof include azo type compounds, such as 2,2'-azobisisobutyronitrile, 2,2'-azobisisovaleronitrile, 2,2'-azobis(2,4-dimethylvaleronitrile), 4,4'-azobis(4-cyanovaleric acid), 1,1'-azobis(cyclohexanecarbonitrile), 2,2'-azobis(2-methylpropane), and 2,2'-azobis(2-methylpropionamidine) dihydrochloride; ketone peroxides, such as methyl ethyl ketone peroxide, methyl isobutyl ketone peroxide, cyclohexanone peroxide, and acetylacetone peroxide; diacyl peroxides, such as isobutyl peroxide, benzoyl peroxide, 2,4-dichlorobenzoyl peroxide, o-methylbenzoyl peroxide, lauroyl peroxide, and p-chlorobenzoyl peroxide; hydroperoxides, such as 2,4,4-trimethylpentyl-2-hydroperoxide, diisopropylbenzene hydroperoxide, cumene hydroperoxide, and tert-butyl hydroperoxide; dialkyl peroxides, such as dicumyl peroxide, tert-butylcumyl peroxide, di-tert-butyl peroxide, and tris (tert-butyl peroxy)triazine; peroxyketals, such as 1,1-di-tert-butylperoxycyclohexane, and 2,2-di(tert-butyl peroxy) butane; alkyl peresters, such as tert-butyl peroxypivalate, tert-butyl peroxy-2-ethylhexanoate, tert-butyl peroxyisobutylate, di-tert-butyl peroxyhexahydroterephthalate, di-tert-butyl peroxyazelate, tert-butyl peroxy-3,5,5-trimethylhexanoate, tert-butyl peroxyacetate, tert-butyl peroxybenzoate, and di-tert-butyl peroxytrimethyladipate; and peroxycarbonates, such as diisopropyl peroxydicarbonate, di-sec-butyl peroxydicarbonate, and tert-butyl peroxyisopropylcarbonate.

Also, the macromolecular compound (A) may be produced by a method in which a monomer mixture is copolymerized in the same manner as in the above except for using, in place of the polymerizable monomer serving as a raw material of the repeating unit represented by the formula (8), a polymerizable monomer having a structure represented by the formula (9):

[Chemical Formula 8]

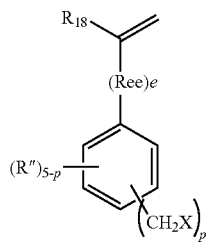

(9)

wherein R", $R_{18}$, $R_{ee}$, e and p have the same meanings as in the above, and X is a halogen atom,
and then the resulting copolymer is reacted with metal salts of N,N-dialkyl-thiocarbamic acid.

Examples of the polymerizable monomers having active hydrogen include 2-hydroxyethyl acrylate, 2-hydroxypropyl acrylate, 3-hydroxypropyl acrylate, 2-hydroxybutyl acrylate, 4-hydroxyphenyl acrylate, 2-hydroxyphenylethyl acrylate, 2-aminoethyl methacrylate, 2-hydroxyethyl methacrylate, 2-hydroxypropyl methacrylate, 3-hydroxypropyl methacrylate, 2-hydroxybutyl methacrylate, 4-hydroxyphenyl methacrylate, 2-hydroxyphenylethyl methacrylate, 4-aminostyrene, 4-allylaniline, 4-aminophenylvinyl ether, 4-(N-phenylamino)phenylallyl ether, 4-(N-methylamino)phenylallyl ether, 4-aminophenylallyl ether, allylamine, 2-aminoethyl acrylate, 4-hydroxystyrene and 4-hydroxyallyl benzene.

The macromolecular compound (A) may also be produced by adding other polymerizable monomers other than the polymerizable monomer serving as a raw material of the repeating unit represented by the formula (1), the polymerizable monomer serving as a raw material of the repeating unit represented by the formula (2), the polymerizable monomer serving as a raw material of the repeating unit represented by the formula (3), the polymerizable monomer serving as a raw material of the repeating unit represented by the formula (4), the polymerizable monomer containing the first functional group and the polymerizable monomer serving as a raw material of the repeating unit represented by the formula (8) to a mixture of the polymerizable monomers.

Examples of the other polymerizable monomers include acrylates and derivatives thereof, methacrylates and derivatives thereof, styrene and derivatives thereof, vinyl acetate and derivatives thereof, methacrylonitrile and derivatives thereof, acrylonitrile and derivatives thereof, vinyl esters of organic carboxylic acids and derivatives thereof, allyl esters of organic carboxylic acids and derivatives thereof, dialkyl esters of fumaric acid and derivatives thereof, dialkyl esters of maleic acid and derivatives thereof, dialkyl esters of itaconic acid and derivatives thereof, N-vinylamide derivatives of organic carboxylic acids, terminal unsaturated hydrocarbons and derivatives thereof, and organic germanium derivatives containing an unsaturated hydrocarbon group.

The kind of the other polymerizable monomer is appropriately selected according to the property required of an insulating layer. From the viewpoint of excellent solvent resistance or reduced hysteresis of an organic thin film transistor, a monomer which forms a hard film having a high molecular density in a film containing a compound derived from the monomer like styrene and styrene derivatives is selected. Further, from the viewpoint of adhesiveness to a surface adjacent to an insulating layer such as the surface of a gate electrode or a substrate or the like, a monomer, which imparts plasticity to the macromolecular compound (A) as with methacrylates and derivatives thereof, and acrylates and derivatives thereof, is selected.

The acrylates and derivatives thereof may be monofunctional acrylates, or may be multifunctional acrylates even though an amount to be used thereof is limited. Examples thereof include methyl acrylate, ethyl acrylate, n-propyl acrylate, isopropyl acrylate, n-butyl acrylate, isobutyl acrylate, sec-butyl acrylate, hexyl acrylate, octyl acrylate, 2-ethylhexyl acrylate, decyl acrylate, isobornyl acrylate, cyclohexyl acrylate, phenyl acrylate, benzyl acrylate, 2-hydroxyethyl acrylate, 2-hydroxypropyl acrylate, 3-hydroxypropyl acrylate, 2-hydroxybutyl acrylate, 2-hydroxyphenylethyl acrylate, ethylene glycol diacrylate, propylene glycol diacrylate, 1,4-butanediol diacrylate, diethylene glycol diacrylate, triethylene glycol diacrylate, trimethylolpropane diacrylate, trimethylolpropane triacrylate, pentaerythritol pentaacrylate, 2,2,2-trifluoroethyl acrylate, 2,2,3,3,3-pentafluoropropyl acrylate, 2-(perfluorobutyl)ethyl acrylate, 3-perfluorobutyl-2-hydroxypropyl acrylate, 2-(perfluorohexyl)ethyl acrylate, 3-perfluorohexyl-2-hydroxypropyl acrylate, 2-(perfluorooctyl)ethyl acrylate, 3-perfluorooctyl-2-hydroxypropyl acrylate, 2-(perfluorodecyl)ethyl acrylate, 2-(perfluoro-3-methylbutyl)ethyl acrylate, 3-(perfluoro-3-methylbutyl)-2-hydroxypropyl acrylate, 2-(perfluoro-5-methylhexyl)ethyl acrylate, 2-(perfluoro-3-methylbutyl)-2-hydroxypropyl acrylate, 3-(perfluoro-5-methylhexyl)-2-hydroxypropyl acrylate, 2-(perfluoro-7-methyloctyl)ethyl acrylate, 3-(perfluoro-7-methyloctyl)-2-hydroxypropyl acrylate, 1H,1H,3H-tetrafluoropropyl acrylate, 1H,1H,5H-octafluoropentyl acrylate, 1H,1H,7H-dodecafluoroheptyl acrylate, 1H,1H,9H-hexadecafluorononyl acrylate, 1H-1-(trifluoromethyl)trifluoroethyl acrylate, 1H,1H,3H-hexafluorobutyl acrylate, N,N-dimethylacrylamide, N,N-diethylacrylamide and N-acryloylmorpholine.

The methacrylates and derivatives thereof may be monofunctional methacrylates, or may be multifunctional methacrylates even though an amount to be used thereof is limited. Examples of the methacrylates and derivatives thereof include methyl methacrylate, ethyl methacrylate, n-propyl methacrylate, isopropyl methacrylate, n-butyl methacrylate, isobutyl methacrylate, sec-butyl methacrylate, hexyl methacrylate, octyl methacrylate, 2-ethylhexyl methacrylate, decyl methacrylate, isobornyl methacrylate, cyclohexyl methacrylate, phenyl methacrylate, benzyl methacrylate, 2-hydroxyethyl methacrylate, 2-hydroxypropyl methacrylate, 3-hydroxypropyl methacrylate, 2-hydroxybutyl methacrylate, 2-hydroxyphenylethyl methacrylate, ethylene glycol dimethacrylate, propylene glycol dimethacrylate, 1,4-butanediol dimethacrylate, diethylene glycol dimethacrylate, triethylene glycol dimethacrylate, trimethylolpropane dimethacrylate, trimethylolpropane trimethacrylate, pentaerythritol pentamethacrylate, 2,2,2-trifluoroethyl methacrylate, 2,2,3,3,3-pentafluoropropyl methacrylate, 2-(perfluorobutyl)ethyl methacrylate, 3-perfluorobutyl-2-hydroxypropyl methacrylate, 2-(perfluorohexyl)ethyl methacrylate, 3-perfluorohexyl-2-hydroxypropyl methacrylate, 2-(perfluorooctyl)ethyl methacrylate, 3-perfluorooctyl-2-hydroxypropyl methacrylate, 2-(perfluorodecyl)ethyl methacrylate, 2-(perfluoro-3-methylbutyl)ethyl methacrylate, 3-(perfluoro-3-methylbutyl)-2-hydroxypropyl methacrylate, 2-(perfluoro-5-methylhexyl)ethyl methacrylate, 2-(perfluoro-3-methylbutyl)-2-hydroxypropyl methacrylate, 3-(perfluoro-5-methylhexyl)-2-hydroxypropyl methacrylate, 2-(perfluoro-7-methyloctyl)ethyl methacrylate, 3-(perfluoro-7-methyloctyl)-2-hydroxypropyl methacrylate, 1H,1H,3H-tetrafluoropropyl methacrylate, 1H,1H,5H-octafluoropentyl methacrylate, 1H,1H,7H-dodecafluoroheptyl methacrylate, 1H,1H,9H-hexadecafluorononyl methacrylate, 1H-1-(trifluoromethyl)trifluoroethyl methacrylate, 1H,1H, 3H-hexafluorobutyl methacrylate, N,N-dimethylmethacrylamide, N,N-diethylmethacrylamide and N-acryloylmorpholine.

Examples of styrene and derivatives thereof include styrene, 2,4-dimethyl-α-methylstyrene, o-methylstyrene, m-methylstyrene, p-methylstyrene, 2,4-dimethylstyrene, 2,5-dimethylstyrene, 2,6-dimethylstyrene, 3,4-dimethylstyrene, 3,5-dimethylstyrene, 2,4,6-trimethylstyrene, 2,4,5-trimethylstyrene, pentamethylstyrene, o-ethylstyrene, m-ethylstyrene, p-ethylstyrene, o-chlorostyrene, m-chlorostyrene, p-chlorostyrene, o-bromostyrene, m-bromostyrene, p-bromostyrene, o-methoxystyrene, m-methoxystyrene, p-methoxystyrene, o-hydroxystyrene, m-hydroxystyrene, p-hydroxystyrene, 2-vinylbiphenyl, 3-vinylbiphenyl, 4-vinylbiphenyl, 1-vinylnaphthalene, 2-vinylnaphthalene, 4-vinyl-p-terphenyl, 1-vinylanthracene, α-methylstyrene, o-isopropenyltoluene, m-isopropenyltoluene, p-isopropenyltoluene, 2,4-dimethyl-α-methylstyrene, 2,3-dimethyl-α-methylstyrene, 3,5-dimethyl-α-methylstyrene, p-isopropyl-α-methylstyrene, α-ethylstyrene, α-chlorostyrene, divinylbenzene, divinylbiphenyl, diisopropylbenzene and 4-aminostyrene.

Examples of the vinyl esters of organic carboxylic acids and derivatives thereof include vinyl acetate, vinyl propionate, vinyl butyrate, vinyl benzoate and divinyl adipate.

Examples of the allyl esters of organic carboxylic acids and derivatives thereof include allyl acetate, allyl benzoate, diallyl adipate, diallyl terephthalate, diallyl isophthalate and diallyl phthalate.

Examples of the dialkyl esters of fumaric acid and derivatives thereof include dimethyl fumarate, diethyl fumarate, diisopropyl fumarate, di-sec-butyl fumarate, diisobutyl fumarate, di-n-butyl fumarate, di-2-ethylhexyl fumarate and dibenzyl fumarate.

Examples of the dialkyl esters of maleic acid and derivatives thereof include dimethyl maleate, diethyl maleate, diisopropyl maleate, di-sec-butyl maleate, diisobutyl maleate, di-n-butyl maleate, di-2-ethylhexyl maleate and dibenzyl maleate.

Examples of the dialkyl esters of itaconic acid and derivatives thereof include dimethyl itaconate, diethyl itaconate, diisopropyl itaconate, di-sec-butyl itaconate, di-isobutyl itaconate, di-n-butyl itaconate, di-2-ethylhexyl itaconate and dibenzyl itaconate.

Examples of the N-vinylamide derivatives of organic carboxylic acids include N-methyl-N-vinylacetamide.

Examples of the terminal unsaturated hydrocarbons and derivatives thereof include 1-butene, 1-pentene, 1-hexene, 1-octene, vinylcyclohexane, vinyl chloride and allyl alcohol.

Examples of the organic germanium derivatives containing an unsaturated hydrocarbon group include allyltrimethylgermanium, allyltriethylgermanium, allyltributylgermanium, trimethylvinylgermanium and triethylvinylgermanium.

Among these compounds, alkyl acrylate, alkyl methacrylate, styrene, acrylonitrile, methacrylonitrile and allyltrimethylgermanium are preferred. When these compounds are used, characteristics of the resulting organic thin film transistor insulating layer are improved.

For example, when nitriles are used as the other polymerizable monomers, a cyano group is introduced into the organic thin film transistor insulating layer, resulting in improvements of solvent resistance and toughness of the insulating layer. Further, in this case, dielectric constant is also improved.

The molar amount to be charged of the polymerizable monomer which serves as a raw material of the repeating unit having a cyclic ether structure in synthesizing the macromolecular compound (A) is preferably 5% by mol or more and 50% by mol or less, and more preferably 20% by mol or more and 40% by mol or less with respect to all the polymerizable monomers which are involved in polymerization. When the molar amount to be charged of the monomer is less than 5% by mol, there is a possibility that a cross-linked structure is not adequately formed within the insulating layer. When the molar amount to be charged of the monomer is more than 50% by mol, electrical properties of the insulating layer may be deteriorated.

The molar amount to be charged of the polymerizable monomer which serves as a raw material of the repeating unit represented by the formula (1) in synthesizing the macromolecular compound (A) is preferably 5% by mol or more and 70% by mol or less, and more preferably 10% by mol or more and 60% by mol or less with respect to all the polymerizable monomers which are involved in polymerization. When the molar amount to be charged of the monomer is less than 5% by mol, there is a possibility that a cross-linked structure is not adequately formed within the insulating layer. When the molar amount to be charged of the monomer is more than 70% by mol, properties of the transistor may be adversely affected.

When the macromolecular compound (A) contains the repeating unit represented by the formula (4), the molar amount to be charged of the polymerizable monomer which serves as a raw material of the repeating unit represented by the formula (4) is preferably 50% by mol or less, and more preferably 40% by mol or less with respect to all the polymerizable monomers which are involved in polymerization. When the molar amount to be charged of the polymerizable monomer which serves as a raw material of the repeating unit represented by the formula (4) is more than 50% by mol, a cross-linked structure may not be adequately formed.

When the macromolecular compound (A) contains the repeating unit containing the first functional group, the molar amount to be charged of the polymerizable monomer containing the first functional group is preferably 50% by mol or less, and more preferably 3% by mol or more and 30% by mol or less with respect to all the polymerizable monomers which are involved in polymerization. When the molar amount to be charged of the polymerizable monomer containing the first functional group is more than 50% by mol, properties of the transistor may be adversely affected.

When the macromolecular compound (A) contains the repeating unit represented by the formula (8), the molar amount to be charged of the polymerizable monomer which serves as a raw material of the repeating unit represented by the formula (8) is preferably 30% by mol or less, and more preferably from 1 to 10% by mol with respect to all the polymerizable monomers which are involved in polymerization. When the molar amount to be charged of the polymerizable monomer which serves as a raw material of the repeating unit represented by the formula (8) is more than 30% by mol, properties of the transistor may be adversely affected.

The macromolecular compound (A) preferably has a weight average molecular weight of from 3000 to 1000000, and more preferably from 5000 to 500000 in terms of polystyrene. The macromolecular compound (A) may be linear, branched, or cyclic.

Examples of the macromolecular compound (A) include poly(4-(1-ethoxyethoxy)styrene-co-glycidyl methacrylate), poly(4-(1-ethoxyethoxy)styrene-co-3-methacryloyloxymethyl-3-ethyl oxetane), poly(4-(methoxymethoxy)styreneco-glycidyl methacrylate), poly(4-(methoxymethoxy)styrene-co-3-methacryloyloxymethyl-3-ethyl oxetane), poly(4-(methoxyethoxymethoxy)styrene-co-glycidyl methacrylate), poly(4-(methoxyethoxymethoxy)styrene-co-3-methacryloyloxymethyl-3-ethyl oxetane), poly(4-(tetrahydropyranyloxy)styrene-co-glycidyl methacrylate), poly(4-(tetrahydropyranyloxy)styrene-co-3-methacryloyloxymethyl-3-ethyl oxetane), poly(4-(cyclopropylmethyloxy)styrene-co-glycidyl methacrylate), poly(4-(cyclopropylmethyloxy)styrene-co-3-methacryloyloxymethyl-3-ethyl oxetane), poly(4-(cyclohexyloxy)styrene-co-glycidyl methacrylate), poly(4-(cyclohexyloxy)styrene-co-3-methacryloyloxymethyl-3-ethyl oxetane), poly(4-(1-ethoxyethoxy)styrene-co-glycidyl methacrylate-co-[2-[O-(1'-methylpropylideneamino)carboxyamino]ethyl-methacrylate]), poly(4-(1-ethoxyethoxy)styrene-co-3-methacryloyloxymethyl-3-ethyl oxetane-co-[2-[O-(1'-methylpropylideneamino)carboxyamino]ethyl-methacrylate]), poly(4-(methoxymethoxy)styrene-co-glycidyl methacrylate-co-[2-[O-(1'-methylpropylideneamino)carboxyamino]ethyl-methacrylate]), poly(4-(methoxymethoxy)styrene-co-3-methacryloyloxymethyl-3-ethyl oxetane-co-[2-[O-(1'-methylpropylideneamino)carboxyamino]ethyl-methacrylate]), poly(4-(methoxyethoxymethoxy)styrene-co-glycidyl methacrylate-co-[2-[O-(1'-methylpropylideneamino)carboxyamino]ethyl-methacrylate]), poly(4-(methoxyethoxymethoxy)styrene-co-3-methacryloyloxymethyl-3-ethyl oxetane-co-[2-[O-(1'-methylpropylideneamino)carboxyamino]ethyl-methacrylate]), poly(4-(tetrahydropyranyloxy)styrene-co-glycidyl methacrylate-co-[2-[O-(1'-methylpropylideneamino)carboxyamino]ethyl-methacrylate]), poly(4-(tetrahydropyranyloxy)styrene-co-3-methacryloyloxymethyl-3-ethyl oxetane-co-[2-[O-(1'-methylpropylideneamino)carboxyamino]ethyl-methacrylate]), poly(4-(cyclopropylmethyloxy)styrene-co-glycidyl methacrylate-co-[2-[O-(1'-methylpropylideneamino)carboxyamino]ethyl-methacrylate]), poly(4-(cyclopropylmethyloxy)styrene-co-3-methacryloyloxymethyl-3-ethyl oxetane-co-[2-[O-(1'-methylpropylideneamino)carboxyamino]ethyl-methacrylate]), poly(4-(cyclohexyloxy)styrene-co-glycidyl methacrylate-co-[2-[O-(1'-methylpropylideneamino)carboxyamino]ethyl-methacrylate]), poly(4-(cyclohexyloxy)styrene-co-3-methacryloyloxymethyl-3-ethyl oxetane-co-[2-[O-(1'-methylpropylideneamino)carboxyamino]ethyl-methacrylate]), poly(4-(1-ethoxyethoxy)styrene-co-glycidyl methacrylate-co-[2-[1'-(3',5'-dimethylpyrazolyl)carbonylamino]ethyl-methacrylate]), poly(4-(1-ethoxyethoxy)styrene-co-3-methacryloyloxymethyl-3-ethyl oxetane-co-[2-[1'-(3',5'-dimethylpyrazolyl)carbonylamino]ethyl-methacrylate]), poly(4-(methoxymethoxy)styrene-co-glycidyl methacrylate-co-[2-[1'-(3',5'-dimethylpyrazolyl)carbonylamino]ethyl-methacrylate]), poly(4-(methoxymethoxy)styrene-co-3-methacryloyloxymethyl-3-ethyl oxetane-co-[2-[1'-(3',5'-dimethylpyrazolyl)carbonylamino]ethyl-methacrylate]), poly(4-(methoxyethoxymethoxy)styrene-co-glycidyl methacrylate-co-[2-[1'-(3',5'-dimethylpyrazolyl)carbonylamino]ethyl-methacrylate]), poly(4-(methoxyethoxymethoxy)styrene-co-3-methacryloyloxymethyl-3-ethyl oxetane-co-[2-[1'-(3',5'-dimethylpyrazolyl)carbonylamino]ethyl-methacrylate]), poly(4-(tetrahydropyranyloxy)styrene-co-glycidyl methacrylate-co-[2-[1'-(3',5'-dimethylpyrazolyl)carbonylamino]ethyl-methacrylate]), poly(4-(tetrahydropyranyloxy)styrene-co-3-methacryloyloxymethyl-3-ethyl oxetane-co-[2-[1'-(3',5'-dimethylpyrazolyl)carbonylamino]ethyl-methacrylate]), poly(4-(cyclopropylmethyloxy)styrene-co-glycidyl methacrylate-co-[2-[1'-(3',5'-dimethylpyrazolyl)carbonylamino]ethyl-methacrylate]), poly(4-(cyclopropylmethyloxy)styrene-co-3-methacryloyloxymethyl-3-ethyl oxetane-co-[2-[1'-(3',5'-dimethylpyrazolyl)carbonylamino]ethyl-methacrylate]), poly(4-(cyclohexyloxy)styrene-co-glycidyl methacrylate-co-[2-[1'-(3',5'-dimethylpyrazolyl)carbonylamino]ethyl-methacrylate]), poly(4-(cyclohexyloxy)styrene-co-3-methacryloyloxymethyl-3-ethyl oxetane-co-[2-[1'-(3',5'-dimethylpyrazolyl)carbonylamino]ethyl-methacrylate]), poly(4-(1-ethoxyethoxy)styrene-co-glycidyl methacrylate-co-pentafluorostyrene), poly(4-(1-ethoxyethoxy)styrene-co-3-methacryloyloxymethyl-3-ethyl oxetane-co-pentafluorostyrene), poly(4-(methoxymethoxy)styrene-co-glycidyl methacrylate-co-pentafluorostyrene), poly(4-(methoxymethoxy)styrene-co-3-methacryloyloxymethyl-3-ethyl oxetane-co-pentafluorostyrene), poly(4-(methoxyethoxymethoxy)styrene-co-glycidyl methacrylate-co-pentafluorostyrene), poly(4-(methoxyethoxymethoxy)styrene-co-3-methacryloyloxymethyl-3-ethyl oxetane-co-pentafluorostyrene), poly(4-(tetrahydropyranyloxy) styrene-co-glycidyl methacrylate-co-pentafluorostyrene), poly(4-(tetrahydropyranyloxy)styrene-co-3-methacryloyloxymethyl-3-ethyl oxetane-co-pentafluorostyrene), poly(4-(cyclopropylmethyloxy)styrene-co-glycidyl methacrylate-co-pentafluorostyrene), poly(4-(cyclopropylmethyloxy)styrene-co-3-methacryloyloxymethyl-3-ethyl oxetane-co-pentafluorostyrene), poly(4-(cyclohexyloxy)styrene-co-glycidyl methacrylate-co-pentafluorostyrene), poly(4-(cyclohexyloxy)styrene-co-3-methacryloyloxymethyl-3-ethyl oxetane-co-pentafluorostyrene), poly(4-(1-ethoxyethoxy)styrene-co-glycidyl methacrylate-co-[2-[O-(1'-methylpropylideneamino)carboxyamino]ethyl-methacrylate]-co-acrylonitrile), poly(4-(1-ethoxyethoxy)styrene-co-3-methacryloyloxymethyl-3-ethyl oxetane-co-[2-[O-(1'-methylpropylideneamino)carboxyamino]ethyl-methacrylate]-co-acrylonitrile), poly(4-(methoxymethoxOstyrene-co-glycidyl methacrylate-co-[2-[O-(1'-methylpropylideneamino)carboxyamino]ethyl-methacrylate]-co-acrylonitrile), poly(4-(methoxymethoxy)styrene-co-3-methacryloyloxymethyl-3-ethyl oxetane-co-[2-[O-(1'-methylpropylideneamino)carboxyamino]ethyl-methacrylate]-co-acrylonitrile), poly(4-(methoxyethoxymethoxy)styrene-co-glycidyl methacrylate-co-[2-[O-(1'-methylpropylideneamino)carboxyamino]ethyl-methacrylate]-co-acrylonitrile), poly(4-(methoxyethoxymethoxy)styrene-co-3-methacryloyloxymethyl-3-ethyl oxetane-co-[2-[O-(1'-methylpropylideneamino)carboxyamino]ethyl-methacrylate]-co-acrylonitrile), poly(4-(tetrahydropyranyloxy)styrene-co-glycidyl methacrylate-co-[2-[O-(1'-methylpropylideneamino)carboxyamino]ethyl-methacrylate]-co-acrylonitrile), poly(4-(tetrahydropyranyloxy)styrene-co-3-methacryloyloxymethyl-3-ethyl oxetane-co-[2-[O-(1'-methylpropylideneamino)carboxyamino]ethyl-methacrylate]-co-acrylonitrile), poly(4-(cyclopropylmethyloxy)styrene-co-glycidyl methacrylate-co-[2-[O-(1'-methylpropylideneamino)carboxyamino]ethyl-methacrylate]-co-acrylonitrile), poly(4-(cyclopropylmethyloxy)styrene-co-3-methacryloyloxymethyl-3-ethyl oxetane-co-[2-[O-(1'-methylpropylideneamino)carboxyamino]ethyl-methacrylate]-co-acrylonitrile), poly(4-(cyclohexyloxy)

styrene-co-glycidyl methacrylate-co-[2-[O-(1'-methylpropylideneamino)carboxyamino]ethyl-methacrylate]-co-acrylonitrile), poly(4-(cyclohexyloxy)styrene-co-3-methacryloyloxymethyl-3-ethyl oxetane-co-[2-[O-(1'-methylpropylideneamino)carboxyamino]ethyl-methacrylate]-co-acrylonitrile), poly(4-(1-ethoxyethoxy)styrene-co-glycidyl methacrylate-co-3-(N,N-diethyldithiocarbamylmethyl)styrene), poly(4-(1-ethoxyethoxy)styrene-co-3-methacryloyloxymethyl-3-ethyl oxetane-co-3-(N,N-diethyldithiocarbamylmethyl)styrene), poly(4-(methoxymethoxy)styrene-co-glycidyl methacrylate-co-3-(N,N-diethyldithiocarbamylmethyl)styrene), poly(4-(methoxymethoxy)styrene-co-3-methacryloyloxymethyl-3-ethyl oxetane-co-3-(N,N-diethyldithiocarbamylmethyl)styrene), poly(4-(methoxyethoxymethoxy)styrene-co-glycidyl methacrylate-co-3-(N,N-diethyldithiocarbamylmethyl)styrene) and poly(4-(methoxyethoxymethoxy)styrene-co-3-methacryloyloxymethyl-3-ethyl oxetane-co-3-(N,N-diethyldithiocarbamylmethyl)styrene).

<Organic Thin Film Transistor Insulating Layer Material>

The organic thin film transistor insulating layer material of the present invention may contain a solvent for mixing a material or adjusting viscosity, a cross-linking agent to be used for cross-linking the macromolecular compound (A), an additive to be used in combination with the cross-linking agent, etc. Examples of the solvent include ether solvents, such as tetrahydrofuran, and diethyl ether, aliphatic hydrocarbon solvents, such as hexane, alicyclic hydrocarbon solvents, such as cyclohexane, unsaturated hydrocarbon solvents, such as pentene, aromatic hydrocarbon solvents, such as xylene, ketone solvents, such as acetone, acetate solvents, such as butyl acetate, alcohol solvents, such as isopropyl alcohol, halogen solvents, such as chloroform, and mixed solvents thereof. As the additive, there can be used a catalyst for promoting a cross-linking reaction, a sensitizing agent, a leveling agent, a viscosity modifier, or the like.

Examples of the catalyst for promoting a cross-linking reaction include a photo acid generating agent and a photo-cation polymerization initiator.

The organic thin film transistor insulating layer material of the present invention preferably includes a photo-cation polymerization initiator. Examples of the photo-cation polymerization initiator include an iodonium salt and a sulfonium salt.

Examples of the iodonium salt include diphenyliodonium hexafluorophosphate, diphenyliodonium hexafluoroantimonate and tolyl-cumyl-iodonium tetrakis(pentafluorophenyl)borate.

Examples of the sulfonium salt include triphenylsulfonium phosphate, p-(phenylthio)phenyl diphenyl sulfonium hexafluorophosphate, triphenyl sulfonium hexafluoroantimonate, p-(phenylthio)phenyl diphenyl sulfonium hexafluoroantimonate, 4,4'-bis[di(β-hydroxyethoxy)phenylsulfonio]phenyl sulfide-bis-hexafluoroantimonate and 4-[4-(4-tert-butylbenzoyl)phenylthio]phenyl-di(4-methylphenyl) sulfonium hexafluorophosphate.

Specific examples of the photo-cation polymerization initiator include a trade name RHODORSIL 2074 (produced by Rhodia Japan, Ltd.), a trade name ADEKA OPTMER SP-150 (produced by ADEKA Co., Ltd.), a trade name ADEKA OPTMER SP-152 (produced by ADEKA Co., Ltd.), a trade name ADEKA OPTMER SP-170 (produced by ADEKA Co., Ltd.), a trade name ADEKA OPTMER SP-172 (produced by ADEKA Co., Ltd.), etc. In addition to these compounds, compounds described in Japanese Patent Laid-open Publication No. H9(1997)-118663 and Japanese Patent Laid-open Publication No. 2007-262401 can also be used.

Examples of the cross-linking agent include low-molecular compounds having two or more cyclic ether structures, low-molecular compounds having two or more double bonds and macromolecular compounds having two or more double bonds.

Examples of the low-molecular compounds having two or more cyclic ether structures include ethylene glycol diglycidyl ether, trimethylolpropane triglycidyl ether, bisphenol A diglycidyl ether, xylene bisoxetane, and 3-ethyl-3{[(3-ethyloxetan-3-yl)methoxy]methyl}oxetane.

Examples of the low-molecular compounds having two or more double bonds include trimethylolpropane trimethacrylate, ethylene glycol dimethacrylate and divinylbenzene.

The macromolecular compound having two or more double bonds can be produced, for example, by reacting a macromolecular compound having two or more active hydrogens with a compound having a double bond and a functional group that reacts with active hydrogen. Also, the macromolecular compound having two or more double bonds can also be produced by reacting a macromolecular compound having two or more haloaryl groups with a boronic acid compound having a double bond.

Examples of the macromolecular compound having two or more active hydrogens include a polyaminostyrene copolymer and a polyhydroxystyrene copolymer.

Examples of the compound having a double bond and a functional group that reacts with active hydrogen include acryloyl chloride, methacryloyl chloride, methacrylic anhydride, vinylphenyl isocyanate, 2-isocyanatoethyl acrylate and 2-isocyanatoethyl methacrylate.

Examples of the macromolecular compound having two or more haloaryl groups include poly(4-bromostyrene) copolymers.

Examples of the boronic acid compound having a double bond include (4-vinylphenyl)boronic acid.

Examples of the macromolecular compounds having two or more double bonds include poly{4-(4'-vinylphenyl)aminocarbonyl aminostyrene}, poly{4-acryloyloxy aminostyrene}, poly{4-(4'-vinylphenyl)aminocarbonyl aminostyrene-co-styrene}, poly{4-acryloyloxy aminostyrene-co-styrene}, poly{4-(4'-vinylphenyl)aminocarbonyl aminostyrene-co-styrene-co-styrene-co-4-(1-ethoxyethoxy)styrene} and poly{4-acryloyloxy aminostyrene-co-styrene-co-styrene-co-4-(1-ethoxyethoxy)styrene}.

The organic thin film transistor insulating layer material of the present invention is a composition used for forming an insulating layer included in an organic thin film transistor. The above composition is preferably used for forming an overcoat layer or a gate insulating layer among the insulating layers of an organic thin film transistor. The organic thin film transistor insulating layer material is preferably an organic thin film transistor overcoat layer composition or an organic thin film transistor gate insulating layer composition, and more preferably an organic thin film transistor gate insulating layer material.

<Organic Thin Film Transistor>

FIG. 1 is a schematic sectional view showing the structure of a bottom-gate/top-contact type organic thin film transistor which is one embodiment of the present invention. This organic thin film transistor includes a substrate 1, a gate electrode 2 formed on the substrate 1, a gate insulating layer 3 formed on the gate electrode 2, an organic semiconductor layer 4 formed on the gate insulating layer 3, a source electrode 5 and a drain electrode 6 formed on the organic semiconductor layer 4 with a channel portion sandwiched therebetween, and an overcoat 7 covering the whole body of the device.

The bottom-gate/top-contact type organic thin film transistor can be produced by, for example, forming a gate electrode on a substrate, forming a gate insulating layer on the gate electrode, forming an organic semiconductor layer on the gate insulating layer, forming a source electrode and a drain electrode on the organic semiconductor layer, and forming an overcoat. The organic thin film transistor insulating layer material of the present invention is suitably used for forming a gate insulating layer as an organic thin film transistor gate insulating layer material. Further, it can also be used for forming an overcoat layer as an organic thin film transistor overcoat layer material.

Figure 2:
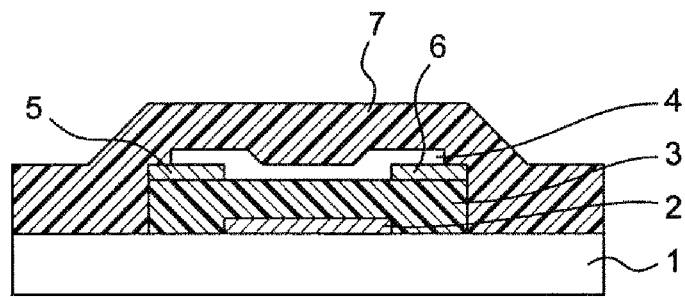
FIG. 2 A schematic cross-sectional view illustrating the structure of a bottom-gate/bottom-contact type organic thin film transistor which is another embodiment of the present invention.

FIG. 2 is a schematic sectional view showing the structure of a bottom-gate/bottom-contact type organic thin film transistor which is one embodiment of the present invention. This organic thin film transistor includes a substrate 1, a gate electrode 2 formed on the substrate 1, a gate insulating layer 3 formed on the gate electrode 2, a source electrode 5 and a drain electrode 6 formed on the gate insulating layer 3 with a channel portion sandwiched therebetween, an organic semiconductor layer 4 formed on the source electrode 5 and the drain electrode 6, and an overcoat 7 covering the whole body of the device.

The bottom-gate/bottom-contact type organic thin film transistor can be produced by, for example, forming a gate electrode on a substrate, forming a gate insulating layer on the gate electrode, forming a source electrode and a drain electrode on the gate insulating layer, forming an organic semiconductor layer on the source electrode and the drain electrode, and forming an overcoat. The organic thin film transistor insulating layer material of the present invention is suitably used for forming a gate insulating layer as an organic thin film transistor gate insulating layer material. Further, it can also be used for forming an overcoat layer as an organic thin film transistor overcoat layer material.

The formation of the gate insulating layer or the overcoat layer is performed by adding, if necessary, a solvent or the like to an organic thin film transistor insulating layer material to prepare an insulating layer application liquid, applying the insulating layer application liquid onto a substrate, and drying and curing the application liquid. Herein, the "substrate" refers to a constituent member of an organic thin film transistor, on which an organic thin film transistor insulating layer is disposed. The organic solvent to be used in the insulating layer application liquid is not particularly limited as long as it can dissolve the organic thin film transistor insulating layer material, and it is preferably an organic solvent having a boiling point of from 100° C. to 200° C. under ambient pressure. Examples of the organic solvent include 2-heptanone (boiling point 151° C.) and propylene glycol monomethyl ether acetate (boiling point 146° C.). A leveling agent, a surfactant, a curing catalyst, etc. can be added to the insulating layer application liquid as necessary.

The insulating layer application liquid can be applied onto an organic semiconductor compound or the gate electrode by a publicly known method, such as spin coating, die coating, screen printing, and inkjet. The application layer to be formed is dried as necessary. The drying referred to herein means removal of the solvent contained in the applied resin composition.

The dried application layer dried is then cured. Curing means that the organic thin film transistor insulating layer material is cross-linked. The cross-linking of the transistor insulating layer material is performed, for example, by irradiating the application layer with electromagnetic waves or electron beams. When the organic thin film transistor insulating layer material includes a catalyst to promote cross-linking, such as a photo-cation polymerization initiator, the catalyst to promote cross-linking is decomposed to produce acid by irradiation with electromagnetic waves or electron beams, and a cyclic ether in the macromolecular compound (A) is ring-opened to polymerize the macromolecular compound (A). Further, by the acid, a group in the repeating unit represented by the formula (1), which is capable of being detached by an acid, is detached to produce a phenolic hydroxyl group, and the phenolic hydroxyl group reacts with a growing terminal of a polymer obtained by polymerizing the macromolecular compound (A) through the ring-opening of the cyclic ether.

One aspect of the method for forming an organic thin film transistor insulating layer of the present invention is a formation method comprising the steps of applying a liquid containing the organic thin film transistor insulating layer material onto a substrate to form an applied layer on the substrate; and irradiating the applied layer with electromagnetic waves or electron beams. When the macromolecular compound (A) has a first functional group and the first functional group is a functional group capable of affording, by the irradiation with electromagnetic waves, a second functional group capable of reacting with active hydrogen, it is preferred to form the organic thin film transistor insulating layer by the formation method.

Another aspect of the method for forming an organic thin film transistor insulating layer of the present invention is a formation method comprising the steps of applying a liquid containing the organic thin film transistor insulating layer material onto a substrate to form an application layer on the substrate; and irradiating the applied layer with electromagnetic waves or electron beams. When the macromolecular compound (A) has a first functional group and the first functional group is a functional group capable of affording, by the action of heat, a second functional group capable of reacting with active hydrogen, it is preferred to form the organic thin film transistor insulating layer by the formation method, and it is more preferred to form the organic thin film transistor insulating layer by a formation method comprising the steps of applying a liquid containing the organic thin film transistor insulating layer material onto a substrate to form an applied layer on the substrate; irradiating the applied layer with electromagnetic waves or electron beams; and applying heat to the applied layer.

When heat is applied to the applied layer, the applied layer is heated to a temperature of from about 80 to 250° C., and preferably from about 100 to 230° C. and maintained at this temperature for from about 5 to 120 minutes, and preferably from about 10 to 60 minutes. When the heating temperature is too low or when the heating time is too short, the cross-linking of the insulating layer may be insufficient, and when the heating temperature is too high or when the heating time is too long, the insulating layer may be damaged.

When the applied layer is subjected to irradiation with electromagnetic waves, irradiation conditions are adjusted in consideration of the degrees of cross-linking and damages of the insulating layer. When the applied layer is heated by application of microwaves, application conditions are adjusted in consideration of the degrees of cross-linking and damages of the insulating layer.

The wavelength of the irradiation electromagnetic wave is preferably 450 nm or less, and more preferably from 150 to 410 nm. When the wavelength of the irradiation electromagnetic wave exceeds 450 nm, the cross-linking of the organic thin film transistor insulating layer material may be insufficient. Ultraviolet rays are preferred as the electromagnetic wave.

The irradiation with ultraviolet light can be performed by using, for example, an aligner that is in use for the production of semiconductors or a UV lamp that is in use for curing UV-curable resins. The irradiation with an electron beam can be performed by using, for example, a miniature electron beam irradiation tube. The heating can be performed by using a heater, an oven, or the like.

On the gate insulating layer may be formed a self-assembled monomolecular film layer. The self-assembled monomolecular film layer can be formed by, for example, treating the gate insulating layer with a solution in which from 1 to 10% by weight of an alkylchlorosilane compound or an alkylalkoxysilane compound has been dissolved in an organic solvent.

Examples of the alkylchlorosilane compound include methyltrichlorosilane, ethyltrichlorosilane, butyltrichlorosilane, decyltrichlorosilane and octadecyltrichlorosilane.

Examples of the alkylalkoxysilane compound include methyltrimethoxysilane, ethyltrimethoxysilane, butyltrimethoxysilane, decyltrimethoxysilane and octadecyltrimethoxysilane.

The substrate 1, the gate electrode 2, the source electrode 5, the drain electrode 6 and the organic semiconductor layer 4 may be constituted using materials and methods which are conventionally used. A plate or a film of resin or plastics, a glass plate, a silicon plate or the like is used for the material of the substrate. The electrodes are formed by a publicly known method, such as a vacuum deposition method, a sputtering method, a printing method or an inkjet method, using chromium, gold, silver, aluminum, molybdenum or the like as their materials.

π-Conjugated polymers are used as an organic semiconductor compound for forming the organic semiconductor layer 4 and, for example, polypyrroles, polythiophenes, polyanilines, polyallylamines, fluorenes, polycarbazoles, polyindoles, and poly(p-phenylenevinylene)s can be used. Moreover, low-molecular substances soluble in organic solvents, for examples, derivatives of polycyclic aromatics such as pentacene, phthalocyanine derivatives, perylene derivatives, tetrathiafulvalene derivatives, tetracyanoquinodimethane derivatives, fullerenes, and carbon nanotubes can be used. Specific examples thereof include a condensate of 2,1,3-benzothiadiazole-4,7-di(ethylene boronate) and 2,6-dibromo-(4,4-bis-hexadecanyl-4H-cyclopenta[2,1-b:3,4-b']-dithiophene, and a condensate of 9,9-di-n-octylfluorene-2,7-di(ethylene boronate) with 5,5'-dibromo-2,2'-bithiophene.

The formation of the organic semiconductor layer is performed, for example, by adding, if necessary, a solvent or the like to an organic semiconductor compound to prepare an organic semiconductor application liquid, applying the organic semiconductor application liquid onto a gate insulating layer, and drying the organic semiconductor application liquid. In the present invention, the resin constituting the gate insulating layer has a benzene ring and has affinity with an organic semiconductor compound. Therefore, a uniform flat interface is formed between an organic semiconductor layer and a gate insulating layer by the above-mentioned application and drying method.

The solvent to be used in the organic semiconductor application liquid is not particularly limited as long as it can dissolve or disperse organic semiconductors, and it is preferably a solvent having a boiling point of from 50° C. to 200° C. under ambient pressure. Examples of the solvent include chloroform, toluene, anisole, 2-heptanone and propylene glycol monomethyl ether acetate. As with the aforementioned insulating layer application liquid, the organic semiconductor application liquid can be applied onto the gate insulating layer by a publicly known method, such as spin coating, die coating, screen printing, and inkjet.

The organic thin film transistor of the present invention may be coated with an overcoat material for the purpose of protecting the organic thin film transistor and improving the smoothness of its surface.

An insulating layer produced by using the organic thin film transistor insulating layer material of the present invention can have a smooth film or the like laminated thereon and can easily form a laminated structure. Moreover, an organic electroluminescence device can be suitably mounted on the insulating layer.

By the use of the organic thin film transistor insulating layer material of the present invention, a member for displays having an organic thin film transistor can be favorably produced. By the use of the member for displays having an organic thin film transistor, a display having a member for displays can be produced.

The organic thin film transistor insulating layer material of the present invention can also be used for applications for forming a layer contained in a transistor other than an insulating layer and a layer contained in an organic electroluminescence device.

EXAMPLES

Hereinafter, the present invention will be described by way of examples, but the present invention is not intended to be limited to these examples.

Synthesis Example 1

Synthesis of Macromolecular Compound 1

In a 50 ml pressure-resistant container (manufactured by ACE GLASS Incorporated), 5.63 g of 4-(1-ethoxyethoxy) styrene (produced by TOSOH ORGANIC CHEMICAL CO., LTD.), 2.50 g of glycidyl methacrylate (produced by Wako Pure Chemical Industries, Ltd.), 2.81 g of 2-(O-[1'-methyl-propylideneamino]carboxyamino)ethyl-methacrylate (produced by Showa Denko K.K., trade name "Karenz MOI-BM"), 0.05 g of 2,2'-azobis(2-methylpropionitrile) and 16.49 g of 2-heptanone (produced by Tokyo Chemical Industry Co., Ltd.) were put, the resulting mixture was bubbled with an argon gas, and then the container was sealed. Polymerization was carried out in an oil bath at 60° C. for 20 hours to obtain a viscous 2-heptanone solution containing a macromolecular compound 1 dissolved therein. The macromolecular compound 1 has the following repeating unit. A suffix to a parenthesis indicates mole fraction of a repeating unit.

[Chemical Formula 9]

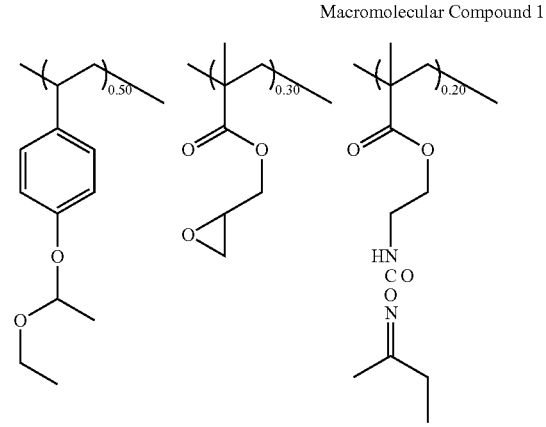

Macromolecular Compound 1

The weight average molecular weight of the resulting macromolecular compound 1 calculated from reference polystyrene was 255000 (GPC manufactured by SHIMADZU CORPORATION, one Tskgel super HM-H and one Tskgel super H2000, mobile phase=THF).

Synthesis Example 2

Synthesis of Compound 2-A

In a 300 ml three-necked flask equipped with a three-way cock and a septum, 33.29 g of 3-ethyl-3-hydroxymethyl oxetane (produced by Toagosei Co., Ltd., trade name: OXT-101), 48.31 g of triethylamine (produced by Wako Pure Chemical Industries, Ltd.), 200 ml of dehydrated tetrahydrofuran (produced by Wako Pure Chemical Industries, Ltd.) and a stirring bar were put, and air within the flask was replaced with nitrogen. The flask was immersed in an ice bath, and 25.00 g of methacryloyl chloride was gradually added dropwise to the reaction mixture with a gas-tight syringe while stirring the reaction mixture by rotating the stirring bar by a magnetic stirrer. After the completion of the dropwise addition, the reaction mixture was further stirred for 2 hours in the ice bath, and then stirred at room temperature overnight to be reacted. After the completion of the reaction, produced triethylamine hydrochloride was separated by filtration and a filtrate liquid was placed in a 500 ml separating funnel, and to this, 200 ml of diethyl ether was added, and then an organic layer was washed with 100 ml of ion-exchange water and separated from the mixture. After repeating water-washing of the organic layer three times, the organic layer was separated and dried with addition of anhydrous magnesium sulfate. After separating anhydrous magnesium sulfate by filtration, a filtrate liquid was concentrated by a rotary evaporator to obtain a compound 2-A as a light brown liquid. A yield amount of the compound 2-A was 29.3 g and a yield thereof was 61.3%.

[Chemical Formula 10]

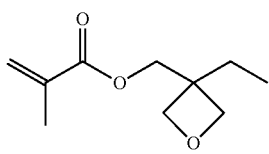

Compound 2-A

Synthesis Example 3

Synthesis of Macromolecular Compound 2

In a 50 ml pressure-resistant container (manufactured by ACE GLASS Inc.), 3.00 g of the compound 2-A, 4.80 g of 4-(1-ethoxyethoxy)styrene (produced by TOSOH ORGANIC CHEMICAL CO., LTD.), 2.40 g of 2-(O-[1'-methylpropylideneamino]carboxyamino)ethyl-methacrylate (produced by Showa Denko K.K., trade name "Karenz MOI-BM"), 0.05 g of 2,2'-azobis(2-methylpropionitrile) and 15.38 g of 2-heptanone (produced by Tokyo Chemical Industry Co., Ltd.) were put, and the resulting mixture was bubbled with an argon gas, and then the container was sealed. Polymerization was carried out in an oil bath at 60° C. for 20 hours to obtain a viscous 2-heptanone solution containing a macromolecular compound 2 dissolved therein. The macromolecular compound 2 has the following repeating unit. A suffix to a parenthesis indicates mole fraction of a repeating unit.

[Chemical Formula 11]

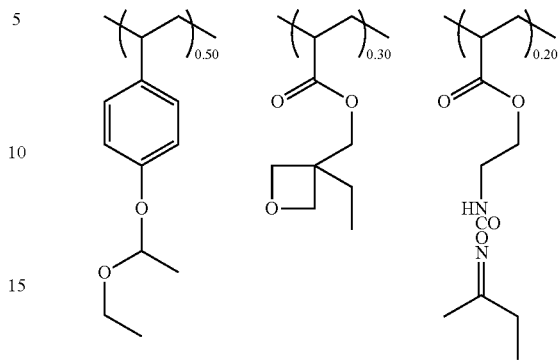

Macromolecular Compound 2

The weight average molecular weight of the resulting macromolecular compound 2 calculated from reference polystyrene was 146000 (GPC manufactured by SHIMADZU CORPORATION, one Tskgel super HM-H and one Tskgel super H2000, mobile phase=THF).

Synthesis Example 4

Synthesis of Macromolecular Compound 3

In a 50 ml pressure-resistant container (manufactured by ACE GLASS Inc.), 3.38 g of 4-(1-ethoxyethoxy)styrene (produced by TOSOH ORGANIC CHEMICAL CO., LTD.), 2.50 g of glycidyl methacrylate (produced by Wako Pure Chemical Industries, Ltd.), 0.62 g of acrylonitrile (produced by Wako Pure Chemical Industries, Ltd.), 2.81 g of 2-(O-[1'-methylpropylideneamino]carboxyamino)ethyl-methacrylate (produced by Showa Denko K.K., trade name "Karenz MOI-BM"), 0.05 g of 2,2'-azobis(2-methylpropionitrile) and 14.04 g of 2-heptanone (produced by Tokyo Chemical Industry Co., Ltd.) were put, and the resulting mixture was bubbled with an argon gas, and then the container was sealed. Polymerization was carried out in an oil bath at 60° C. for 20 hours to obtain a viscous 2-heptanone solution containing a macromolecular compound 3 dissolved therein. The macromolecular compound 3 has the following repeating unit. A suffix to a parenthesis indicates mole fraction of a repeating unit.

[Chemical Formula 12]

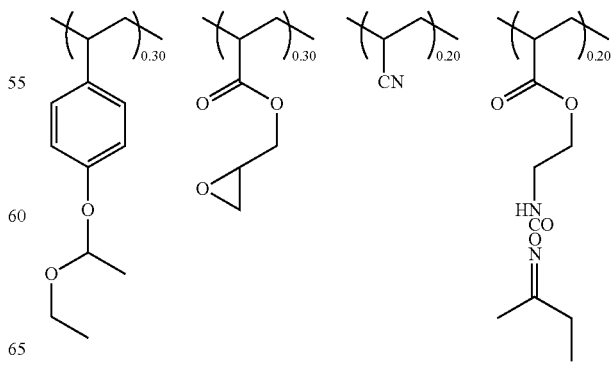

Macromolecular Compound 3

Synthesis Example 5

Synthesis of Macromolecular Compound 4

To 80 ml of toluene 80 containing 1.88 g of 2,1,3-benzothiadiazole-4,7-di(ethylene boronate) and 3.81 g of 2,6-dibromo-(4,4-bis-hexadecanyl-4H-cyclopenta[2,1-b:3,4-b']-dithiophene), 0.75 g of tetrakis(triphenyl phosphine) palladium, 1.0 g of methyltrioctylammonium chloride (produced by Aldrich Chemical Company, Inc., trade name "Aliquat 336" (registered trademark)) and 24 ml of a 2M aqueous sodium carbonate solution were added under a nitrogen atmosphere. The resulting mixture was stirred vigorously and heated to reflux for 24 hours. A viscous reaction mixture was poured into 500 ml of acetone to precipitate a fibrous yellow polymer. This polymer was collected by filtration, washed with acetone, and dried at 60° C. in a vacuum oven overnight. The resulting polymer is referred to as a macromolecular compound 4. The macromolecular compound 4 has the following repeating unit. n represents the number of the repeating unit.

[Chemical Formula 13]

Macromolecular Compound 4

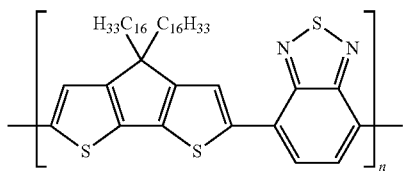

The weight average molecular weight of the resulting macromolecular compound 4 calculated from reference polystyrene was 32000 (GPC manufactured by SHIMADZU CORPORATION, one Tskgel super HM-H and one Tskgel super H2000, mobile phase=THF).

Synthesis Example 6

Synthesis of Macromolecular Compound 5

In a 50 ml pressure-resistant container (manufactured by ACE GLASS Inc.), 1.92 g of 4-(1-ethoxyethoxy)styrene (produced by TOSOH ORGANIC CHEMICAL CO., LTD.), 4.00 g of the compound 2-A, 0.71 g of acrylonitrile (produced by Wako Pure Chemical Industries, Ltd.), 1.60 g of 2-(O-[1'-methylpropylideneamino]carboxyamino)ethyl-methacrylate (produced by Showa Denko K.K., trade name "Karenz MOI-BM"), 1.74 g of styrene (produced by Wako Pure Chemical Industries, Ltd.), 0.05 g of 2,2'-azobis(2-methylpropionitrile) and 23.36 g of 2-heptanone (produced by Tokyo Chemical Industry Co., Ltd.) were put, and the resulting mixture was bubbled with an argon gas, and then the container was sealed. Polymerization was carried out in an oil bath at 60° C. for 20 hours to obtain a viscous 2-heptanone solution containing a macromolecular compound 5 dissolved therein. The macromolecular compound 5 has the following repeating unit. A suffix to a parenthesis indicates mole fraction of a repeating unit.

[Chemical Formula 14]

Macromolecular Compound 5

The weight average molecular weight of the resulting macromolecular compound 5 calculated from reference polystyrene was 69000 (GPC manufactured by SHIMADZU CORPORATION, one Tskgel super HM-H and one Tskgel super H2000, mobile phase=THF).

Synthesis Example 7

Synthesis of Macromolecular Compound 6

In a 50 ml pressure-resistant container (manufactured by ACE GLASS Inc.), 1.88 g of 4-(1-ethoxyethoxy)styrene (produced by TOSOH ORGANIC CHEMICAL CO., LTD.), 3.00 g of the compound 2-A, 0.46 g of glycidyl methacrylate (produced by Wako Pure Chemical Industries, Ltd.), 2.19 g of 4-vinylanisole (produced by Aldrich Chemical Company, Inc.), 0.69 g of acrylonitrile (produced by Wako Pure Chemical Industries, Ltd.), 0.78 g of 2-(O-[1'-methylpropylideneamino]carboxyamino)ethyl-methacrylate (produced by Showa Denko K.K., trade name "Karenz MOI-BM"), 0.33 g of methyl methacrylate (produced by Wako Pure Chemical Industries, Ltd.), 0.04 g of 2,2'-azobis(2-methylpropionitrile) and 21.86 g of 2-heptanone (produced by Tokyo Chemical Industry Co., Ltd.) were put, and the resulting mixture was bubbled with an argon gas, and then the container was sealed. Polymerization was carried out in an oil bath at 80° C. for 8 hours to obtain a viscous 2-heptanone solution containing a macromolecular compound 6 dissolved therein. The macromolecular compound 5 has the following repeating unit. A suffix to a parenthesis indicates mole fraction of a repeating unit.

[Chemical Formula 15]

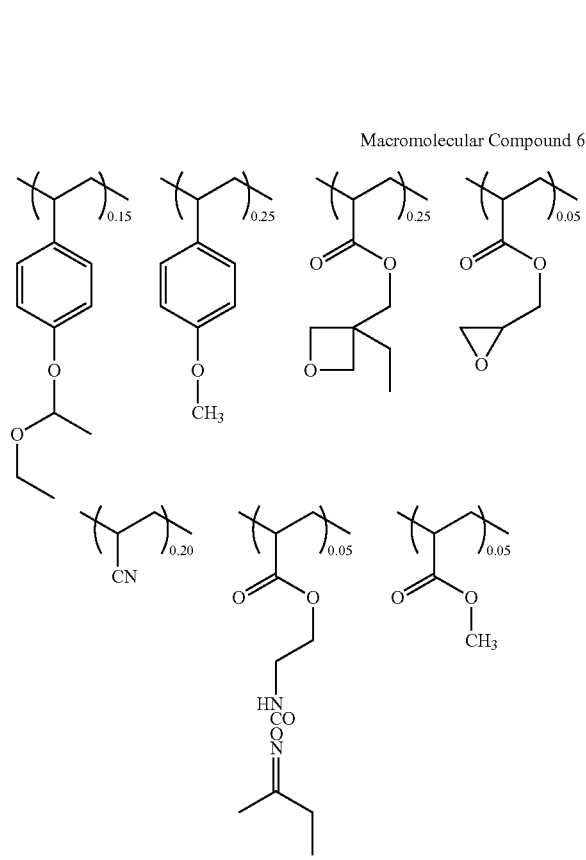

Macromolecular Compound 6

The weight average molecular weight of the resulting macromolecular compound 6 calculated from reference polystyrene was 98000 (GPC manufactured by SHIMADZU CORPORATION, one Tskgel super HM-H and one Tskgel super H2000, mobile phase=THF).

Synthesis Example 8

Synthesis of Macromolecular Compound 7

In a 50 ml pressure-resistant container (manufactured by ACE GLASS Inc.), 1.88 g of 4-(1-ethoxyethoxy)styrene (produced by TOSOH ORGANIC CHEMICAL CO., LTD.), 3.00 g of the compound 2-A, 0.46 g of glycidyl methacrylate (produced by Wako Pure Chemical Industries, Ltd.), 2.19 g of 4-vinylanisole (produced by Aldrich Chemical Company, Inc.), 0.69 g of acrylonitrile (produced by Wako Pure Chemical Industries, Ltd.), 0.65 g of methyl methacrylate (produced by Wako Pure Chemical Industries, Ltd.), 0.04 g of 2,2'-azobis(2-methylpropionitrile) and 20.79 g of 2-heptanone (produced by Tokyo Chemical Industry Co., Ltd.) were put, and the resulting mixture was bubbled with an argon gas, and then the container was sealed. Polymerization was carried out in an oil bath at 80° C. for 8 hours to obtain a viscous 2-heptanone solution containing a macromolecular compound 7 dissolved therein. The macromolecular compound 7 has the following repeating unit. A suffix to a parenthesis indicates mole fraction of a repeating unit.

[Chemical Formula 16]

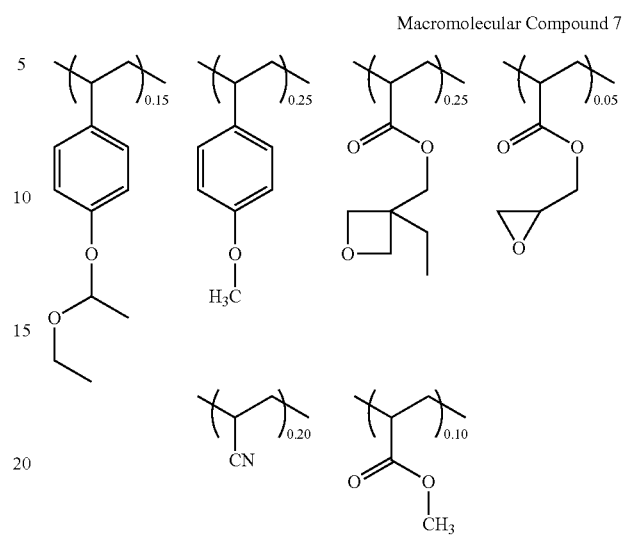

Macromolecular Compound 7

The weight average molecular weight of the resulting macromolecular compound 7 calculated from reference polystyrene was 118000 (GPC manufactured by SHIMADZU CORPORATION, one Tskgel super HM-H and one Tskgel super H2000, mobile phase=THF).

Synthesis Example 9

Synthesis of Compound 8-A

In a 500 ml three-necked flask equipped with a Dimroth condenser, 10.00 g of vinylbenzyl chloride (produced by Aldrich Chemical Company, Inc.), 17.69 g of N,N-diethyldithiocarbamate trihydrate (produced by Wako Pure Chemical Industries, Ltd.), 200 ml of acetone (produced by Wako Pure Chemical Industries, Ltd.) and a stirring bar were put, and the flask was immersed in an oil bath, and a reaction mixture was reacted for 20 hours under a reflux while stirring the reaction mixture by rotating the stirring bar by a magnetic stirrer. After the completion of the reaction, a precipitated substance was separated by filtration, and a filtrate liquid was concentrated by a rotary evaporator. The resulting viscous liquid was dissolved in 200 ml of diethyl ether, and then an organic layer was washed with 100 ml of ion-exchange water and separated from the mixture. After repeating water-washing of the organic layer three times, the organic layer was separated and dried with addition of anhydrous magnesium sulfate. After separating anhydrous magnesium sulfate by filtration, a filtrate liquid was concentrated by a rotary evaporator to obtain a compound 8-A as a yellow-brown liquid. A yield amount of the compound 8-A was 15 g and a yield thereof was 86%.

[Chemical Formula 17]

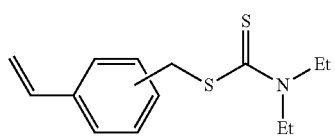

Compound 8-A

Synthesis Example 10

Synthesis of Macromolecular Compound 8

In a 50 ml pressure-resistant container (manufactured by ACE GLASS Inc.), 1.88 g of 4-(1-ethoxyethoxy)styrene (produced by TOSOH ORGANIC CHEMICAL CO., LTD.), 3.00 g of the compound 2-A, 0.69 g of acrylonitrile (produced by Wako Pure Chemical Industries, Ltd.), 0.86 g of the compound 8-A, 0.33 g of methyl methacrylate (produced by Wako Pure Chemical Industries, Ltd.), 0.46 g of glycidyl methacrylate (produced by Wako Pure Chemical Industries, Ltd.), 2.19 g of 4-vinylanisole (produced by Aldrich Chemical Company, Inc.), 0.05 g of 2,2'-azobis(2-methylpropionitrile) and 22.05 g of 2-heptanone (produced by Tokyo Chemical Industry Co., Ltd.) were put, and the resulting mixture was bubbled with an argon gas, and then the container was sealed. Polymerization was carried out in an oil bath at 80° C. for 8 hours to obtain a viscous 2-heptanone solution containing a macromolecular compound 8 dissolved therein. The macromolecular compound 8 has the following repeating unit. A suffix to a parenthesis indicates mole fraction of a repeating unit.

[Chemical Formula 18]

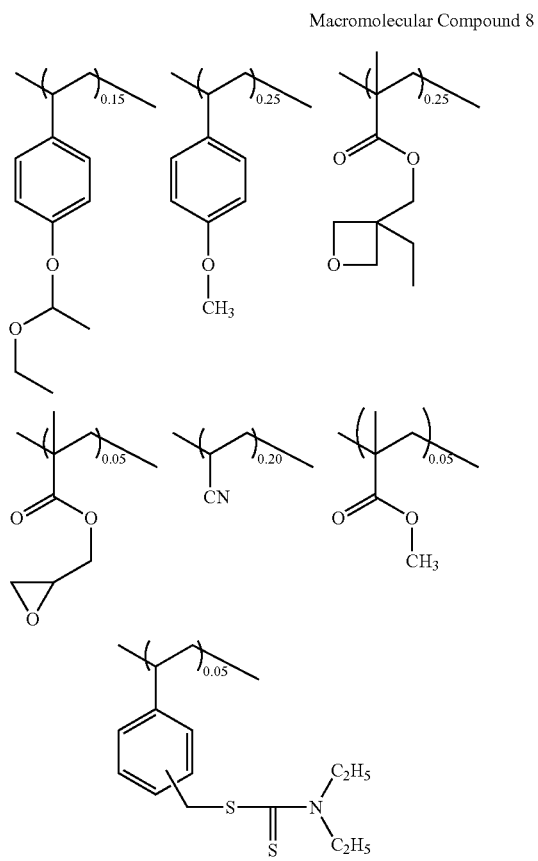

Macromolecular Compound 8

The weight average molecular weight of the resulting macromolecular compound 8 calculated from reference polystyrene was 75000 (GPC manufactured by SHIMADZU CORPORATION, one Tskgel super HM-H and one Tskgel super H2000, mobile phase=THF).

Synthesis Example 11

Synthesis of Macromolecular Compound 9

In a 50 ml pressure-resistant container (manufactured by ACE GLASS Inc.), 1.73 g of 4-(1-ethoxyethoxy)styrene (produced by TOSOH ORGANIC CHEMICAL CO., LTD.), 3.00 g of the compound 2-A, 0.43 g of glycidyl methacrylate (produced by Wako Pure Chemical Industries, Ltd.), 2.01 g of 4-vinylanisole (produced by Aldrich Chemical Company, Inc.), 0.64 g of acrylonitrile (produced by Wako Pure Chemical Industries, Ltd.), 1.44 g of 2-(O-[1'-methylpropylideneamino]carboxyamino)ethyl-methacrylate (produced by Showa Denko K.K., trade name "Karenz MOI-BM"), 0.05 g of 2,2'-azobis(2-methylpropionitrile) and 21.68 g of 2-heptanone (produced by Tokyo Chemical Industry Co., Ltd.) were put, and the resulting mixture was bubbled with an argon gas, and then the container was sealed. Polymerization was carried out in an oil bath at 80° C. for 8 hours to obtain a viscous 2-heptanone solution containing a macromolecular compound 9 dissolved therein. The macromolecular compound 9 has the following repeating unit. A suffix to a parenthesis indicates mole fraction of a repeating unit.

[Chemical Formula 19]

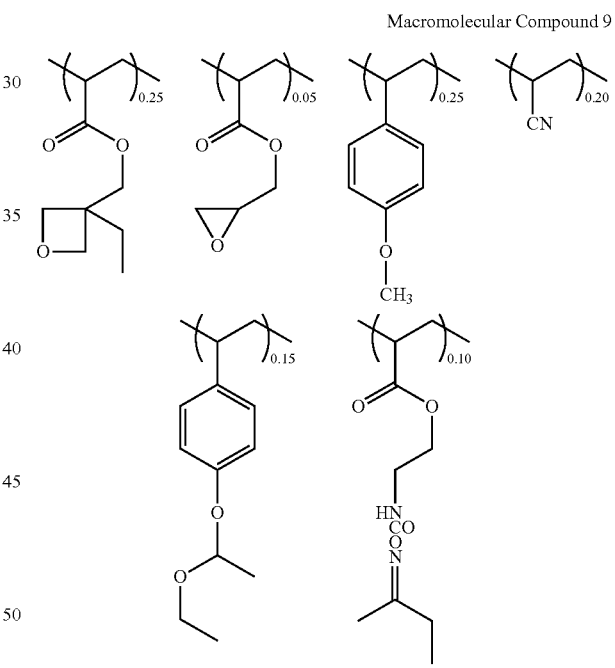

Macromolecular Compound 9

The weight average molecular weight of the resulting macromolecular compound 9 calculated from reference polystyrene was 95000 (GPC manufactured by SHIMADZU CORPORATION, one Tskgel super HM-H and one Tskgel super H2000, mobile phase=THF).

Example 1

Production of Organic Thin Film Transistor Insulating Layer Material and Electric Field Effect Type Organic Thin Film Transistor In a 10 ml sample bottle, 1.00 g of a 2-heptanone solution of the macromolecular compound 1 obtained in Synthesis Example 1, 0.004 g of a photoinitiator PI 2074 (produced by Rhodia Japan, Ltd.) serving as a photo-cation polymerization initiator, 0.0008 g of 9,10-dibutoxyanthracene (DBA) (produced by Kawasaki Kasei Chemicals) serving as a photosensitizer and 2.00 g of 2-heptanone were put, and the resulting mixture was dissolved while being stirred to prepare a uniform application solution 1 serving as an organic thin film transistor insulating layer material.

The resulting application solution 1 was filtered with a membrane filter having a pore diameter of 0.2 μm, applied onto a glass substrate with a chromium electrode by spin coating, and then dried on a hot plate at 100° C. for 1 minute. Thereafter, the dried coated film on the substrate was irradiated with UV light (wavelength 365 nm) of 600 mJ/cm$^2$ by the use of an aligner (manufactured by Canon Inc.; PLA-521), and baked at 220° C. for 30 minutes on a hot plate in a nitrogen atmosphere to obtain a gate insulating layer.

Then, the macromolecular compound 4 was dissolved in xylene as a solvent to prepare a solution (organic semiconductor composition) having a concentration of 0.5% by weight, and the solution was filtered through a membrane filter to prepare an application liquid.

The resulting application liquid was applied onto the aforementioned gate insulating layer by a spin coating method to form an active layer having a thickness of about 30 nm, and subsequently a source electrode and a drain electrode, each having a channel length of 20 μm and a channel width of 2 mm, were formed on the active layer by a vacuum deposition method using a metal mask, and thereby an electric field effect type organic thin film transistor was produced. Each of the source electrode and the drain electrode has a laminated structure in the order of molybdenum oxide and gold from the active layer side.

<Evaluation of Transistor Characteristics>

With respect to the thus-produced electric field effect type organic thin film transistors, the transistor characteristics thereof were measured by using a vacuum prober (BCT22MDC-5-HT-SCU; manufactured by Nagase Electronic Equipments Service Co., Ltd.) under conditions such that a gate voltage Vg was varied from 20 to −40V and a source-drain voltage Vsd was varied from 0 to −40 V. The results are shown in Table 1.

The hysteresis of the electric field effect type organic thin film transistor was expressed by a voltage difference between a threshold voltage Vth1 measured when the gate voltage Vg was varied from 20 V to −40 V at a source-drain voltage Vsd of −40V and a threshold voltage Vth2 measured when the gate voltage Vg was varied from −40 V to 20 V.

Example 2

Production of Organic Thin Film Transistor Insulating Layer Material and Electric Field Effect Type Organic Thin Film Transistor In a 10 ml sample bottle, 1.00 g of a 2-heptanone solution of the macromolecular compound 2 obtained in Synthesis Example 3, 0.004 g of a photoinitiator PI 2074 (produced by Rhodia Japan, Ltd.), 0.0008 g of DBA (produced by Kawasaki Kasei Chemicals) and 2.00 g of 2-heptanone were put, and the resulting mixture was dissolved while being stirred to prepare a uniform application solution 2 serving as an organic thin film transistor insulating layer material.

An electric field effect type organic thin film transistor was produced and the transistor characteristics thereof were evaluated in the same manner as in Example 1 except that the application solution 2 was used in place of the application solution 1. The results are shown in Table 1.

Example 3

Production of Organic Thin Film Transistor Insulating Layer Material and Electric Field Effect Type Organic Thin Film Transistor In a 10 ml sample bottle, 1.00 g of a 2-heptanone solution of the macromolecular compound 3 obtained in Synthesis Example 4, 0.004 g of a photoinitiator PI 2074 (produced by Rhodia Japan, Ltd.), 0.0008 g of DBA (produced by Kawasaki Kasei Chemicals) and 2.00 g of 2-heptanone were put, and the resulting mixture was dissolved while being stirred to prepare a uniform application solution 3 serving as an organic thin film transistor insulating layer material.

An electric field effect type organic thin film transistor was produced and the transistor characteristics thereof were evaluated in the same manner as in Example 1 except that the application solution 3 was used in place of the application solution 1. The results are shown in Table 1.

Example 4

Production of Organic Thin Film Transistor Insulating Layer Material and Electric Field Effect Type Organic Thin Film Transistor In a 10 ml sample bottle, 1.00 g of a 2-heptanone solution of the macromolecular compound 5 obtained in Synthesis Example 6, 0.004 g of a photoinitiator PI 2074 (produced by Rhodia Japan, Ltd.), 0.0008 g of DBA (produced by Kawasaki Kasei Chemicals) and 2.00 g of 2-heptanone were put, and the resulting mixture was dissolved while being stirred to prepare a uniform application solution 4 serving as an organic thin film transistor insulating layer material.

An electric field effect type organic thin film transistor was produced and the transistor characteristics thereof were evaluated in the same manner as in Example 1 except that the application solution 4 was used in place of the application solution 1. The results are shown in Table 1.

Example 5

Production of Organic Thin Film Transistor Insulating Layer Material and Electric Field Effect Type Organic Thin Film Transistor In a 10 ml sample bottle, 1.00 g of a 2-heptanone solution of the macromolecular compound 6 obtained in Synthesis Example 7, 0.004 g of a photoinitiator PI 2074 (produced by Rhodia Japan, Ltd.), 0.0008 g of DBA (produced by Kawasaki Kasei Chemicals) and 2.00 g of 2-heptanone were put, and the resulting mixture was dissolved while being stirred to prepare a uniform application solution 5 serving as an organic thin film transistor insulating layer material.

An electric field effect type organic thin film transistor was produced and the transistor characteristics thereof were evaluated in the same manner as in Example 1 except that the application solution 5 was used in place of the application solution 1. The results are shown in Table 1.

Example 6

Production of Organic Thin Film Transistor Insulating Layer Material and Electric Field Effect Type Organic Thin Film Transistor In a 10 ml sample bottle, 1.00 g of a 2-heptanone solution of the macromolecular compound 7 obtained in Synthesis Example 8, 0.004 g of a photoinitiator PI 2074 (produced by Rhodia Japan, Ltd.), 0.0008 g of DBA (produced by Kawasaki Kasei Chemicals) and 2.00 g of 2-heptanone were put, and the resulting mixture was dissolved while being stirred to prepare a uniform application solution 6 serving as an organic thin film transistor insulating layer material.

An electric field effect type organic thin film transistor was produced and the transistor characteristics thereof were evaluated in the same manner as in Example 1 except that the application solution 6 was used in place of the application solution 1. The results are shown in Table 1.

Example 7

Production of Organic Thin Film Transistor Insulating Layer Material and Electric Field Effect Type Organic Thin Film Transistor In a 10 ml sample bottle, 1.00 g of a 2-heptanone solution of the macromolecular compound 8 obtained in Synthesis Example 10, 0.015 g of divinylbenzene, 0.004 g of a photoinitiator PI 2074 (produced by Rhodia Japan, Ltd.), 0.0008 g of DBA (produced by Kawasaki Kasei Chemicals) and 1.00 g of 2-heptanone were put, and the resulting mixture was dissolved while being stirred to prepare a uniform application solution 7 serving as an organic thin film transistor insulating layer material.

An electric field effect type organic thin film transistor was produced and the transistor characteristics thereof were evaluated in the same manner as in Example 1 except that the application solution 7 was used in place of the application solution 1. The results are shown in Table 1.

Example 8

Production of Organic Thin Film Transistor Insulating Layer Material and Electric Field Effect Type Organic Thin Film Transistor In a 10 ml sample bottle, 1.00 g of a 2-heptanone solution of the macromolecular compound 2 obtained in Synthesis Example 3, 0.008 g of a photo acid generating agent LW-S1 (produced by San-Apro Ltd.) and 1.00 g of 2-heptanone were put, and the resulting mixture was dissolved while being stirred to prepare a uniform application solution 8 serving as an organic thin film transistor insulating layer material.

An electric field effect type organic thin film transistor was produced and the transistor characteristics thereof were evaluated in the same manner as in Example 1 except that the application solution 8 was used in place of the application solution 1. The results are shown in Table 1.

Example 9

Production of Organic Thin Film Transistor Insulating Layer Material and Electric Field Effect Type Organic Thin Film Transistor In a 10 ml sample bottle, 1.50 g of a 2-heptanone solution of the macromolecular compound 9 obtained in Synthesis Example 11, 0.009 g of a photo acid generating agent LW-S1 (produced by San-Apro Ltd.) and 1.00 g of 2-heptanone were put, and the resulting mixture was dissolved while being stirred to prepare a uniform application solution 9 serving as an organic thin film transistor insulating layer material.

An electric field effect type organic thin film transistor was produced and the transistor characteristics thereof were evaluated in the same manner as in Example 1 except that the application solution 9 was used in place of the application solution 1. The results are shown in Table 1.

Comparative Example 1

Production of Electric Field Effect Type Organic Thin Film Transistor

In a 10 ml sample bottle, 1.00 g of polyvinylphenol-co-polymethyl methacrylate (produced by Aldrich Chemical Company, Inc., Mn=6700), 0.163 g of N,N,N',N',N'',N''-hexamethoxymethylmelamine (produced by Sumitomo Chemical Co., Ltd.), 0.113 g of a thermal acid generator (produced by Midori Kagaku Co., Ltd., trade name: TAZ-108) and 7.00 g of 2-heptanone were put, and the resulting mixture was stirred and dissolved to prepare a uniform application solution 8.

An electric field effect type organic thin film transistor was produced in the same manner as in Example 1 except that the application solution 8 was used in place of the application solution 1 and UV irradiation was not performed at the time of the formation of a gate insulating layer. The transistor characteristics thereof were measured and evaluated, and consequently the produced transistor did not work as a transistor in a region where a gate voltage Vg is 20 V to −40 V.

TABLE 1

|  | Hysteresis | Vth1 |
| --- | --- | --- |
| Example 1 | 0.0 V | −3.7 V |
| Example 2 | 6.8 V | 12.8 V |
| Example 3 | 3.0 V | 6.8 V |
| Example 4 | 4.3 V | −5.7 V |
| Example 5 | 2.3 V | −6.4 V |
| Example 6 | 1.1 V | −6.0 V |
| Example 7 | 1.7 V | −2.8 V |
| Example 8 | 1.6 V | 10.5 V |
| Example 9 | 1.8 V | −4.9 V |
| Comparative Example 1 | not work | |

DESCRIPTION OF THE REFERENCE NUMERALS

1: Substrate
2: Gate electrode
3: Gate insulating layer
4: Organic semiconductor layer
5: Source electrode
6: Drain electrodes
7: Overcoat

The invention claimed is:

1. An organic thin film transistor insulating layer material comprising a macromolecular compound (A) which contains a repeating unit having a cyclic ether structure and a repeating unit represented by the formula (1):

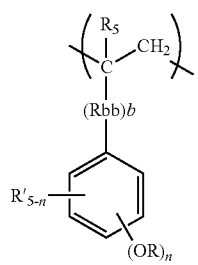

(1)

wherein $R_5$ represents a hydrogen atom or a methyl group; $R_{bb}$ represents a linking moiety which links the main chain of the macromolecular compound with a side chain of the macromolecular compound and optionally has a fluorine atom; R represents an organic group capable of being detached by an acid; R' represents a hydrogen atom or a monovalent organic group having from 1 to 20 carbon atoms, wherein any hydrogen atom in the monovalent organic group having 1 to 20 carbon atoms has optionally been substituted with a fluorine atom; b represents an integer of 0 or 1, and n represents an integer of from 1 to 5; and when there are two or more Rs, they may be the same or different; and when there are two or more R's, they may be the same or different.

2. The organic thin film transistor insulating layer material according to claim 1, wherein the repeating unit having a cyclic ether structure is at least one repeating unit selected from the group consisting of a repeating unit represented by the formula (2):

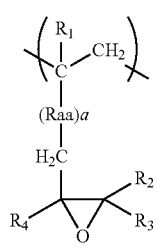

(2)

wherein $R_1$ represents a hydrogen atom or a methyl group; $R_2$ to $R_4$ each independently represent a hydrogen atom or a monovalent organic group having from 1 to 20 carbon atoms; $R_{aa}$ represents a linking moiety which links the main chain of the macromolecular compound with a side chain of the macromolecular compound, and optionally has a fluorine atom; and a represents an integer of 0 or 1, and a repeating unit represented by the formula (3):

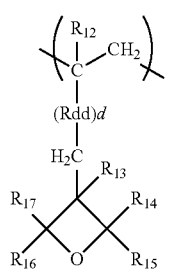

(3)

wherein $R_{12}$ represents a hydrogen atom or a methyl group; $R_{13}$ to $R_{17}$ each independently represent a hydrogen atom or a monovalent organic group having from 1 to 20 carbon atoms; $R_{dd}$ represents a linking moiety which links the main chain of the macromolecular compound with a side chain of the macromolecular compound, and optionally has a fluorine atom; and d represents an integer of 0 or 1.

3. The organic thin film transistor insulating layer material according to claim 1, wherein the macromolecular compound (A) further contains a repeating unit containing a first functional group, wherein the first functional group is a functional group capable of affording, by the action of electromagnetic waves or heat, a second functional group capable of reacting with an active hydrogen.

4. The organic thin film transistor insulating layer material according to claim 3, wherein the first functional group is at least one group selected from the group consisting of an isocyanato group blocked with a blocking agent and an isothiocyanato group blocked with a blocking agent.

5. The organic thin film transistor insulating layer material according to claim 4, wherein the isocyanato group blocked with a blocking agent and the isothiocyanato group blocked with a blocking agent are groups represented by the formula (5):

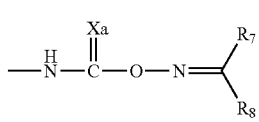

(5)

wherein Xa represents an oxygen atom or a sulfur atom, and $R_7$ and $R_8$ each independently represent a hydrogen atom or a monovalent organic group having from 1 to 20 carbon atoms.

6. The organic thin film transistor insulating layer material according to claim 4, wherein the isocyanato group blocked with a blocking agent and the isothiocyanato group blocked with a blocking agent are groups represented by the formula (6):

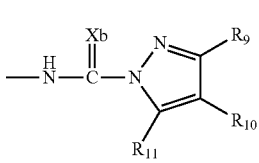

(6)

wherein Xb represents an oxygen atom or a sulfur atom, and $R_9$ and $R_{11}$ each independently represent a hydrogen atom or a monovalent organic group having from 1 to 20 carbon atoms.

7. The organic thin film transistor insulating layer material according to claim 1, wherein the macromolecular compound (A) further contains a repeating unit represented by the formula (4):

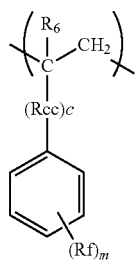
(4)

wherein $R_6$ represents a hydrogen atom or a methyl group; Rf represents a fluorine atom or a monovalent organic group having from 1 to 20 carbon atoms and optionally having a fluorine atom; $R_{cc}$ represents a linking moiety which links the main chain of the macromolecular compound with a side chain of the macromolecular compound, and optionally has a fluorine atom; c represents an integer of 0 or 1, and m represents an integer of from 1 to 5; and when there are two or more Rfs, they may be the same or different from one another, provided that at least one Rf is a fluorine atom or a monovalent organic group having from 1 to 20 carbon atoms and having a fluorine atom.

8. The organic thin film transistor insulating layer material according to claim 1 wherein the macromolecular compound (A) further contains a repeating unit represented by the formula (8):

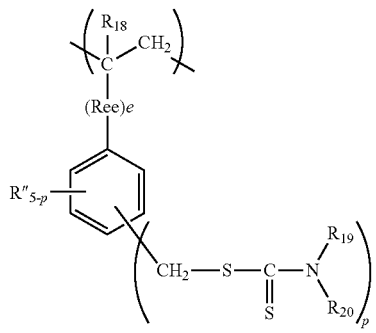
(8)

wherein $R_{18}$ represents a hydrogen atom or a methyl group; $R_{ee}$ represents a linking moiety which links the main chain of the macromolecular compound with a side chain of the macromolecular compound, and optionally has a fluorine atom; $R_{19}$, $R_{20}$ and R" each represent a hydrogen atom or a monovalent organic group having from 1 to 20 carbon atoms; any hydrogen atom in the monovalent organic group having from 1 to 20 carbon atoms has optionally been substituted with a fluorine atom; e represents an integer of 0 or 1 and p represents an integer of from 1 to 5.

9. A method for forming an organic thin film transistor insulating layer comprising the steps of:
applying a liquid containing the organic thin film transistor insulating layer material according to claim 1 onto a substrate to form an applied layer on the substrate; and
irradiating the applied layer with electromagnetic waves or electron beams.

10. The method for forming an organic thin film transistor insulating layer according to claim 9, wherein the electromagnetic waves are ultraviolet rays.

11. A method for forming an organic thin film transistor insulating layer comprising the steps of:
applying a liquid containing the organic thin film transistor insulating layer material according to claim 1 onto a substrate to form an applied layer on the substrate;
irradiating the applied layer with electromagnetic waves or electron beams; and
applying heat to the applied layer.

12. The method for forming an organic thin film transistor insulating layer according to claim 11, wherein the electromagnetic waves are ultraviolet rays.

13. An organic thin film transistor having an organic thin film transistor insulating layer formed by using the organic thin film transistor insulating layer material according to claim 1.

14. The organic thin film transistor according to claim 13, wherein the organic thin film transistor insulating layer is a gate insulating layer.

15. A member for a display, the member comprising the organic thin film transistor according to claim 13.

16. A display comprising the member for a display according to claim 15.

* * * * *